(12) United States Patent
Asakawa et al.

(10) Patent No.: US 8,628,673 B2
(45) Date of Patent: Jan. 14, 2014

(54) RESIN COMPOSITION FOR PATTERN FORMATION, PATTERN FORMATION METHOD AND PROCESS FOR PRODUCING LIGHT-EMITTING ELEMENT

(75) Inventors: Koji Asakawa, Tokyo (JP); Ryota Kitagawa, Tokyo (JP); Akira Fujimoto, Tokyo (JP); Yoshiaki Shirae, Tokyo (JP); Tomohiro Yorisue, Tokyo (JP); Akihiko Ikeda, Tokyo (JP)

(73) Assignees: Kabushiki Kaisha Toshiba, Tokyo (JP); Asahi Kasei E-Materials Corporation, Tokyo (JP)

( * ) Notice: Subject to any disclaimer, the term of this patent is extended or adjusted under 35 U.S.C. 154(b) by 95 days.

(21) Appl. No.: 13/319,928

(22) PCT Filed: May 12, 2010

(86) PCT No.: PCT/JP2010/058050
§ 371 (c)(1),
(2), (4) Date: Jan. 3, 2012

(87) PCT Pub. No.: WO2010/131680
PCT Pub. Date: Nov. 18, 2010

(65) Prior Publication Data
US 2012/0097640 A1   Apr. 26, 2012

(30) Foreign Application Priority Data

May 13, 2009 (JP) ................. 2009-116885

(51) Int. Cl.
*B29D 11/00* (2006.01)

(52) U.S. Cl.
USPC .............. 216/24; 216/22; 216/56; 216/40; 216/67; 252/79.1; 252/79.2; 252/79.3; 252/79.4; 521/61

(58) Field of Classification Search
USPC .......... 252/79.1–79.4; 216/22, 24, 40, 56, 67; 521/61
See application file for complete search history.

(56) References Cited

U.S. PATENT DOCUMENTS 5,286,790 A * 2/1994 Laughner .................. 525/67
(Continued)

FOREIGN PATENT DOCUMENTS

| JP | 2003-155365 | * | 5/2003 |
| JP | 2003-155365 A | | 5/2003 |
| JP | 2005-8882 A | | 1/2005 |

OTHER PUBLICATIONS

International Search Report, dated Aug. 10, 2010 in PCT/JP2010/058050.

*Primary Examiner* — Nadine G Norton
*Assistant Examiner* — Maki Angadi
(74) *Attorney, Agent, or Firm* — Birch, Stewart, Kolasch & Birch, LLP

(57) ABSTRACT

Disclosed are: a resin composition for pattern formation, which enables the stable formation of a pattern at a level of the wavelength of light; a method for forming a pattern having a sea-island structure using the composition; and a process for producing a light-emitting element that can achieve high luminous efficiency properties. The resin composition for pattern formation comprises: (a) a specific block copolymer containing an aromatic ring-containing polymer and a poly (meth)acrylate as block moieties; (b) a homopolymer of a specific aromatic ring-containing polymer; and (c) a homopolymer of a specific poly(meth)acrylate, wherein the ratio of the total amount of the aromatic ring-containing homopolymer (b) and the poly(meth)acrylate homopolymer (c) relative to the entire resin composition is 0% by weight to 90% by weight, and the total amount of an aromatic ring-containing polymer moiety contained in the block copolymer (a) as a block moiety and the aromatic ring-containing homopolymer (b) relative to the entire resin composition is 10% by weight to 60% by weight.

24 Claims, 2 Drawing Sheets

(56) References Cited

U.S. PATENT DOCUMENTS 6,565,763 B1 * 5/2003 Asakawa et al. ............... 216/56
6,780,499 B2 * 8/2004 Gates et al. ............... 428/315.7
2007/0122749 A1 * 5/2007 Fu et al. ............... 430/311

* cited by examiner

RESIN COMPOSITION FOR PATTERN FORMATION, PATTERN FORMATION METHOD AND PROCESS FOR PRODUCING LIGHT-EMITTING ELEMENT

TECHNICAL FIELD

The present invention relates to a composition for pattern formation, a pattern formation method and a process for producing a light-emitting element that realizes high luminous efficiency properties by enabling light generated within an element to be extracted to the outside at high efficiency.

BACKGROUND ART

Light-emitting elements are being required to demonstrate improved luminous efficiency and brightness. There are two methods for improving the luminous efficiency of light-emitting elements, consisting of improving the generation efficiency of light when electrical energy is converted to light within the element (internal quantum efficiency) and improving the efficiency at which the generated light is efficiently extracted outside the element (light extraction efficiency, external quantum efficiency). Considerable research on internal quantum efficiency has resulted in tremendous improvement in recent years. However, since light-emitting element materials typically cause light to be trapped within the element due to such factors as high refractive index and total internal reflection, the light extraction efficiency by which light generated within the element is extracted outside the element is extremely low.

Consequently, attempts have been made to prevent reflection by creating a refractive index gradient by providing nanometer level irregularities on the surface of light-emitting elements as well as extract primary diffracted light by creating a diffraction grating on the surface. However, since these measures require extremely minute processing on the nanometer level, the use of electron beam lithography has been studied at the research level while nano imprinting has been examined for volume production. However, these methods have the shortcoming of requiring the use of costly equipment, while also encountering production difficulty due to the need to fabricate regular structures of nanometer size.

In addition, although known examples of technologies used to roughen a light-emitting surface include technologies consisting of roughening the surface by treating with hydrochloric acid, sulfuric acid, hydrogen peroxide or a mixture thereof (refer to Patent Document 1 and Patent Document 2), since these methods have an effect on crystallinity of the substrate, some surfaces cannot be roughened depending on the exposed orientation. Consequently, since a light-emitting surface cannot always be roughened, there are limitations on the improvement of light extraction efficiency.

PRIOR ART DOCUMENTS

Patent Documents

Patent Document 1: Japanese Unexamined Patent Publication No. 2001-151834
Patent Document 2: Japanese Unexamined Patent Publication No. 2003-258296
Patent Document 3: Japanese Unexamined Patent Publication No. 2006-108635
Patent Document 4: Japanese Unexamined Patent Publication No. 2001-100419

SUMMARY OF THE INVENTION

Problems to be Solved by the Invention

The light extraction efficiency of light-emitting elements such as light-emitting diodes (LED) is improved by providing a fine structure on the surface thereof. The use of lithography (Patent Document 1), which utilizes self-assembly of block copolymers, to fabricate this fine structure enables a hyperfine structure to be efficiently produced at low cost. This method is compatible with fine processing of LED surfaces and enables the brightness of LED to be improved at low cost (Patent Document 2). However, as research progressed further, the incorporation of anti-reflection effects and diffraction effects were found to be highly effective as phenomena effective for improving light extraction (Patent Document 3), and the need for an irregular surface structure having a pitch near the wavelength of the light was found to be necessary with respect to diffraction in particular. In the case of methods used to fabricate nanometer level irregular surface structures using block copolymers, although it is easy to realize patterns of 100 nm or less since these methods utilize the self-assembly of molecules, it is difficult to form patterns of more than 100 nm. In addition, although the use of blended polymers combining two or more types of homopolymers facilitates formation at a pitch of about 1 μm (Patent Document 4), differing from block copolymers, since the resulting structures are not fixed by molecular bonds, this method has the shortcoming of being unable to ensure high process stability. Moreover, although there have been examples of having formed patterns having a pitch on the order of several hundred nanometers by combining a block copolymer of a specific molecular weight and a homopolymer contained in the block copolymer as a block moiety thereof followed by heat treatment in the presence of nitrogen, in this case, there is the shortcoming of low light extraction efficiency due to the low circularity coefficient of the resulting pattern (Patent Document 3).

An object of the present invention is to provide a resin composition for pattern formation enabling stable pattern formation, a method for forming a pattern having a sea-island structure enabling stable pattern formation, and a process for producing a light-emitting element that realizes high luminous efficiency properties by enabling light generated inside the element to be efficiently extracted to the outside.

Means for Solving the Problems

As a result of conducting extensive studies and experiments, the inventors of the present invention succeeded in completing the present invention.

Namely, the present invention is a composition for pattern formation, a pattern formation method and a process for producing a light-emitting element as described below.

[1] A resin composition for pattern formation comprising the following:

a block copolymer (a) containing an aromatic ring-containing polymer and a poly(meth)acrylate as block moieties, wherein the number average molecular weight of the block copolymer (a) is 300,000 to 5,000,000, the ratio of the total of the aromatic ring-containing polymer moiety and the poly(meth)acrylate moiety to the entire block polymer (a) is 50 mol % or more, and the molar ratio of the aromatic ring-containing polymer moiety to the poly(meth)acrylate moiety is 1:1 to 1:5;

an aromatic ring-containing homopolymer (b) composed of a monomer that composes the aromatic ring-containing polymer contained in the block copolymer (a) as a block moiety, wherein the weight average molecular weight of the aromatic ring-containing homopolymer is 1,500 to 8,000; and a poly(meth)acrylate homopolymer (c) composed of a monomer that composes the poly(meth)acrylate contained in the block copolymer (a) as a block moiety, wherein the weight average molecular weight of the poly(meth)acrylate homopolymer (c) is 1,500 to 14,000; wherein, the weight ratio of the total of the aromatic ring-containing homopolymer (b) and the poly(meth)acrylate homopolymer (c) to the entire resin composition is 10% by weight to 90% by weight, and the weight ratio of the total of the aromatic ring-containing polymer moiety contained in the block copolymer (a) as a block moiety and the aromatic ring-containing homopolymer (b) to the entire resin composition is 10% by weight to 60% by weight.

[2] The resin composition for pattern formation described in [1] above, wherein the aromatic ring-containing polymer contained in the block copolymer (a) as a block moiety is polystyrene.

[3] The resin composition for pattern formation described in [1] or [2] above, wherein the block copolymer (a) is a diblock copolymer of polystyrene and poly(methyl methacrylate).

[4] The resin composition for pattern formation described in any of [1] to [3] above, wherein the weight average molecular weight of the aromatic ring-containing homopolymer (b) is 1,500 to 5,000.

[5] The resin composition for pattern formation described in [4] above, wherein the weight average molecular weight of the aromatic ring-containing homopolymer (b) is 2,500 to 5,000.

[6] The resin composition for pattern formation described in any of [1] to [5] above, wherein the aromatic ring-containing homopolymer (b) has an $R_1R_2(CN)C$— group on the terminal thereof wherein, $R_1$ and $R_2$ mutually and independently represent a $C_1$-$C_6$ alkyl group or alkoxyalkyl group.

[7] The resin composition for pattern formation described in [6] above, wherein $R_1$ and $R_2$ are both methyl groups.

[8] The resin composition for pattern formation described in any of [1] to [7] above, wherein the weight average molecular weight of the poly(meth)acrylate homopolymer (c) is 2,500 to 14,000.

[9] The resin composition for pattern formation described in any of [1] to [8] above, wherein the poly(meth)acrylate homopolymer (c) has an aliphatic group on the terminal thereof.

[10] The resin composition for pattern formation described in any of [1] to [9] above, wherein the weight ratio of the total of the aromatic ring-containing homopolymer (b) and the poly(meth)acrylate homopolymer (c) to the entire resin composition is 40% by weight to 80% by weight, and the weight ratio of the total of the aromatic ring-containing polymer moiety contained in the block copolymer (a) as a block moiety and the aromatic ring-containing homopolymer (b) to the entire resin composition is 20% by weight to 50% by weight.

[11] A solution for pattern formation obtained by dissolving the resin composition for pattern formation described in any of [1] to [10] above in a solvent, wherein the weight ratio of the resin composition to the solution is 1% by weight to 30% by weight.

[12] The solution for pattern formation described in [11] above, wherein the solvent is at least one type of solvent selected from the group consisting of ethyl cellosolve acetate, propylene glycol monomethyl ether acetate, N-methylpyrrolidone, γ-butyrolactone, cyclopentanone, propylene glycol monomethyl ether and ethyl lactate.

[13] A method for forming a pattern having a sea-island structure, comprising the steps of:

coating the solution for pattern formation described in [11] or [12] above onto a substrate, and evaporating the solvent in the solution to form a thin film having a thickness of 1 μm or less, and heating the thin film at a temperature of 130° C. to 280° C. over a time from 1 minute to 100 hours; wherein, the pattern having a sea-island structure is a microphase separation structure in which an aromatic ring-containing polymer phase serves as the islands and a poly(meth)acrylate polymer phase serves as the sea, the average center of gravity distance between the islands is 200 nm to 800 nm, and the area average circularity coefficient of the islands is 0.7 or more.

[14] The method for forming a pattern having a sea-island structure described in [13] above, wherein the step for heating the thin film is carried out on a hot plate over a time of 1 minute to 1 hour.

[15] The method for forming a pattern having a sea-island structure described in [13] above, wherein the step for heating the thin film is carried out in an oven.

[16] The method for forming a pattern having a sea-island structure described in [13] above, wherein the step for heating the thin film is carried out in a mixed gas atmosphere of oxygen and an inert gas in which the oxygen concentration is 0.05% by volume to 25% by volume.

[17] The method for forming a pattern having a sea-island structure described in [16] above, wherein the step for heating the thin film is carried out in a mixed gas atmosphere of oxygen and an inert gas in which the oxygen concentration is 0.05% by volume to 15% by volume.

[18] A process for producing a light-emitting element, comprising the steps of:

selectively removing at least one of the phases of a sea-island structure formed by the pattern formation method described in any of [13] to [17] above, and etching the surface of the light-emitting element using the remaining phase as an etching mask.

[19] A method for forming a pattern having a sea-island structure, comprising the steps of:

(1) forming a thin film having a thickness of 1 μm or less by coating onto a substrate a solution of a resin composition for pattern formation comprising the following:

a block copolymer (a) containing an aromatic ring-containing polymer and a poly(meth)acrylate as block moieties, wherein the number average molecular weight of the block copolymer (a) is 300,000 to 5,000,000, the ratio of the total of the aromatic ring-containing polymer moiety and the poly (meth)acrylate moiety to the entire block polymer (a) is 50 mol % or more, and the molar ratio of the aromatic ring-containing polymer moiety to the poly(meth)acrylate moiety is 1:1 to 1:5;

an aromatic ring-containing homopolymer (b) composed of a monomer that composes the aromatic ring-containing polymer contained in the block copolymer (a) as a block moiety, wherein the weight average molecular weight of the aromatic ring-containing homopolymer (b) is 1,500 to 8,000; and/or a poly(meth)acrylate homopolymer (c) composed of a monomer that composes the poly(meth)acrylate contained in the block copolymer (a) as a block moiety, wherein the weight average molecular weight of the poly(meth)acrylate homopolymer (c) is 1,500 to 5,000,000; wherein, the weight ratio of the total of the aromatic ring-containing homopolymer (b) and the poly(meth)acrylate homopolymer (c) to the entire resin composition is 0% by weight to 90% by weight, and the weight ratio of the total of the aromatic ring-containing polymer moiety contained in the block copolymer (a) as a block moiety and the aromatic ring-containing homopolymer (b) to the entire resin composition is 10% by weight to 60% by weight, followed by evaporating the solvent in the solution; and, (2) heating the thin film at a temperature of 130° C. to 280° C. over a time of 1 minute to 100 hours in a mixed gas atmosphere of oxygen and an inert gas in which the oxygen concentration is 0.05% by volume to 25% by volume; wherein the pattern having a sea-island structure is a microphase separation structure in which an aromatic ring-containing polymer layer serves as the islands and a poly(meth)acrylate polymer phase serves as the sea, the average center of gravity distance between the islands is 200 nm to 800 nm, and the area average circularity coefficient of the islands is 0.65 or more.

[20] The method for forming a pattern having a sea-island structure described in [19] above, wherein the weight ratio of the total of the aromatic ring-containing homopolymer (b) and the poly(meth)acrylate homopolymer (c) to the entire resin composition is 10% by weight to 90% by weight.

[21] The method for forming a pattern having a sea-island structure described in [19] or [20] above, wherein the step for heating the thin film is carried out in a mixed gas atmosphere of oxygen and an inert gas in which the oxygen concentration is 0.05% by volume to 15% by volume.

[22] The method for forming a pattern having a sea-island structure described in any of [19] to [21] above, wherein the step for heating the thin film is carried out on a hot plate over a time of 1 minute to 1 hour.

[23] The method for forming a pattern having a sea-island structure described in any of [19] to [21] above, wherein the step for heating the thin film is carried out in an oven.

[24] A process for producing a light-emitting element having a structure containing fine surface irregularities in the surface thereof, comprising the steps of:

using a light-emitting element as a substrate, forming a pattern having a sea-island structure in the surface thereof according to the pattern formation method described in any of [19] to [23] above, and selectively removing at least one of the phases of the formed sea-island structure; and etching the surface of the light-emitting element by using the remaining phase as an etching mask.

Effects of the Invention

Use of the resin composition for forming a pattern according to the present invention makes it possible to form a pattern having a pitch roughly equal to the wavelength of light both stably and with favorable circularity, as well as improve the brightness of a light-emitting element by transferring this pattern to the surface of a light-emitting element and forming a structure consisting of fine surface irregularities on the surface of the light-emitting element.

EMBODIMENTS OF THE INVENTION

<Resin Composition for Pattern Formation>

Figure 1:
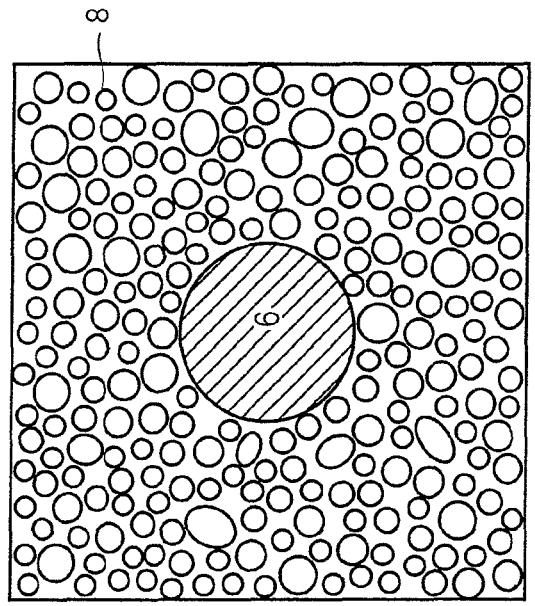
FIG. 1 consists of a cross-sectional view (a) and an upper overhead view (b) of a semiconductor light-emitting element according to the present invention.
Figure 1:
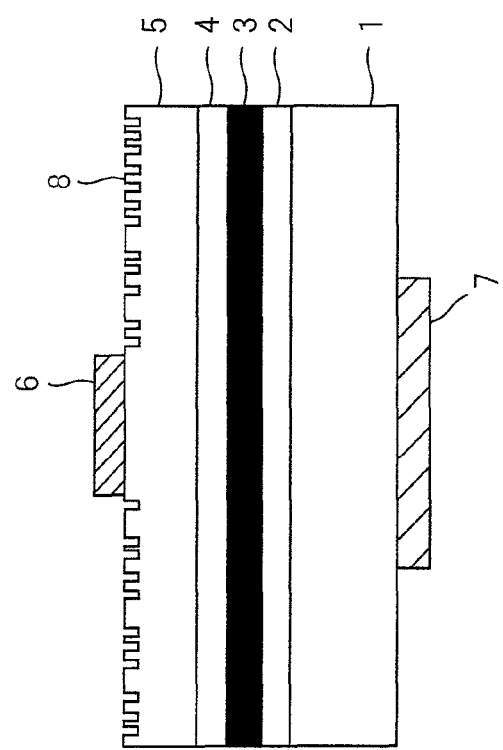

First, an explanation is provided of a resin composition for pattern formation.

The resin composition for pattern formation is a resin composition containing a block copolymer (a), an aromatic ring-containing homopolymer (b) and a poly(meth)acrylate homopolymer (c).

The block copolymer (a) is a block copolymer containing an aromatic ring-containing polymer and a poly(meth)acrylate as block moieties, wherein the number average molecular weight of the block copolymer (a) is 300,000 to 5,000,000, and the ratio of the total of the aromatic ring-containing polymer moiety and the poly(meth)acrylate moiety to the entire block copolymer (a) is 50 mol % or more, and the molar ratio of the poly(meth)acrylate moiety to the aromatic ring-containing polymer moiety is 1:1 to 1:5.

The aromatic ring-containing homopolymer (b) is an aromatic ring-containing homopolymer composed of a monomer that composes the aromatic ring-containing polymer contained in the block copolymer (a) as a block moiety, and the weight average molecular weight of the aromatic ring-containing homopolymer (b) is 1,500 to 8,000.

The poly(meth)acrylate homopolymer (c) is a poly(meth)acrylate homopolymer composed of a monomer that composes the poly(meth)acrylate contained in the block copolymer (a) as a block moiety, and the weight average molecular weight of the poly(meth)acrylate homopolymer (c) is 1,500 to 14,000.

The weight ratio of the total of the aromatic ring-containing homopolymer (b) and the poly(meth)acrylate homopolymer (c) to the entire resin composition for pattern formation is 10% by weight to 90% by weight, and the weight ratio of the total of the aromatic ring-containing polymer moiety contained in the block copolymer (a) as a block moiety and the aromatic ring-containing homopolymer (b) to the entire resin composition for pattern formation is 10% by weight to 60% by weight.

In the present description, (meth)acrylate refers to acrylate and/or methacrylate.

The resin composition for pattern formation forms a pattern having a sea-island structure in which the aromatic ring-containing polymer moiety serves as islands and the poly(meth)acrylate moiety serves as sea by spontaneously causing phase separation between the aromatic ring-containing moiety (consisting mainly of the aromatic ring-containing polymer block moiety contained in the block copolymer (a) and the aromatic ring-containing homopolymer (b)) and the poly(meth)acrylate moiety (consisting mainly of the poly(meth)acrylate block moiety contained in the block copolymer (a) and the poly(meth)acrylate homopolymer (c)). Here, the sea-island structure refers to a structure in which a small amount of a dispersion phase (islands) are interspersed in a large amount of a continuous phase (sea) in the case of viewing the phase separation structure formed by the two types of polymers two-dimensionally. Furthermore, in the present description, the sea of the sea-island structure is also referred to as a matrix while the islands are also referred to as dots.

Since the aromatic ring-containing polymer moiety has higher resistance to etching than the poly(meth)acrylate moiety, an island (dot) pattern can be formed from the aromatic ring-containing polymer moiety by selectively etching only the sea moiety of the sea-island structure. A structure consisting of fine surface irregularities can then ultimately be formed on the surface of the light-emitting element by etching the underlying base by using the island pattern as a mask and then further transferring the pattern to the light-emitting element.

In the present invention, use of the resin composition for pattern formation allows the obtaining of a pattern having a sea-island structure in which the average center of gravity distance between islands is roughly equal to the wavelength of the light (for example, 200 nm to 800 nm) and the area average circularity coefficient of the islands is preferably 0.7 or more, and more preferably 0.8 or more, from the viewpoint of improving brightness of the light-emitting element.

Here, the average center of gravity distance between islands refers to the average value of the distance between centers of gravity of adjacent islands, and can be calculated using image analysis software (such as A-ZO KUN (available from Asahi Kasei Engineering)).

In addition, the circularity coefficient C of the islands is a value from 0 to 1 determined according to the following formula:

circularity coefficient $C=4\pi\times$(island area)/(island circumference)$^2$ with shape increasingly deviating from a circle as the value of C becomes smaller and approaching the shape of a circle as the value of C becomes larger.

In addition, the area average circularity coefficient $<C_A>$ of the islands is a parameter defined based on the circularity coefficient C of each island according to the following formula:

island area circularity coefficient $<C_A>=\Sigma(C_iA_i)/\Sigma A_i$ wherein, $C_i$ is the circularity coefficient of an ith island, and $A_i$ is the area of an ith island.

Introduction of the concept of area average makes it possible to express the apparent circularity of the islands more accurately in comparison with simply using the average circularity coefficient as a result of weighting islands having a large area.

From the viewpoint of increasing brightness of a light-emitting element, the value of the area average circularity coefficient $<C_A>$ is preferably close to 1 since the action of the island structure on light is proportional to the area thereof.

Next, an explanation is provided of the constituent components of the resin composition for pattern formation.

First, an explanation is provided of the block copolymer (a).

The aromatic ring-containing polymer, which is one of the essential components of the blocks that compose the block copolymer (a) used in the present invention, is a homopolymer of a vinyl monomer having an aromatic ring or a heterocyclic ring such as pyridine ring as a side chain thereof, examples of which include polystyrene (PS), polymethylstyrene, polyethylstyrene, poly(t-butylstyrene), polymethoxystyrene, poly(N,N-dimethylaminostyrene), polychlorostyrene, polybromostyrene, polytrifluoromethylstyrene, polytrimethylsilylstyrene, polydivinylbenzene, polycyanostyrene, poly(α-methylstyrene), polyvinylnaphthalene, polyvinylbiphenyl, polyvinylpyrene, polyvinylphenanthrene, polyisopropenylnaphthalene and polyvinylpyridine. Here, from the viewpoints of availability of the starting monomer and ease of synthesis, the most preferably used aromatic ring-containing polymer is polystyrene.

The poly(meth)acrylate, which is another essential component of the blocks that compose the block copolymer (a) used in the present invention, is at least one type of homopolymer or copolymer selected from the group consisting of the following acrylate monomers and methacrylate monomers. Examples of members of the group consisting acrylate monomers and methacrylate monomers able to be used here include methyl methacrylate (MMA), ethyl methacrylate, n-propyl methacrylate, isopropyl methacrylate, n-butyl methacrylate, isobutyl methacrylate, t-butyl methacrylate, n-hexyl methacrylate, cyclohexyl methacrylate, methyl acrylate, ethyl acrylate, n-propyl acrylate, isopropyl acrylate, n-butyl acrylate, isobutyl acrylate, t-butyl acrylate, n-hexyl acrylate and cyclohexyl acrylate. Here, from the viewpoints of availability of the starting monomer and ease of synthesis, the most preferably used poly(meth)acrylate is the homopolymer of methyl methacrylate (PMMA).

The block copolymer (a) used in the present invention is a diblock, triblock or multiblock copolymer in which one end or both ends of the aforementioned aromatic ring-containing polymer is bound to one end or both ends of the aforementioned poly(meth)acrylate, and from the viewpoint of ease of synthesis, is preferably a diblock copolymer in which one end each of the aromatic ring-containing polymer and the poly (meth)acrylate are bound, and more preferably a diblock copolymer of polystyrene and poly(methyl methacrylate).

Furthermore, the block copolymer (a) can also contain blocks of other polymer components at a ratio that does not exceed 50 mol % in addition to the aforementioned aromatic ring-containing polymer moiety and poly(meth)acrylate moiety. Specific examples of other polymer components include polyethylene oxide, polypropylene oxide and polytetramethylene glycol.

The block copolymer (a) can be synthesized by living anionic polymerization, living radical polymerization or coupling of polymers having reactive terminal groups. In the case of living anionic polymerization, for example, a block copolymer of an aromatic ring-containing polymer and poly (meth)acrylate can be sized by first synthesizing the aromatic ring-containing polymer using an anionic species such as butyl lithium as an initiator, and then polymerizing the (meth) acrylate monomer by using the terminals thereof as initiators. At this time, the molecular weight of the resulting polymer can be increased by decreasing the amount of initiator added, and the molecular weight of the polymer can be controlled as designed by removing internal impurities such as water and air. In addition, when polymerizing the poly(meth)acrylate moiety, side reactions can be inhibited by lowering the temperature of the system to 0° C. or lower. In the case of living radical polymerization, a block copolymer of an aromatic ring-containing polymer and poly(meth)acrylate can be obtained by first adding a halogen compound such as bromine to double bonds of the (meth)acrylate monomer to halogenate the terminals thereof and synthesize the poly(meth)acrylate by using a copper complex as a catalyst, and then synthesizing the aromatic ring-containing polymer by using the terminal halogen.

A block copolymer of an aromatic ring-containing polymer and poly(meth)acrylate can also be synthesized by first synthesizing the aromatic ring-containing polymer by living anionic polymerization and halogenating the terminals thereof, followed by reacting a (meth)acrylate monomer in the presence of a copper catalyst. The coupling of polymers having reactive terminal groups refers to a method for obtaining a block copolymer of an aromatic ring-containing polymer and poly(meth)acrylate by, for example, reacting an aromatic ring-containing polymer having amino groups on the terminals thereof with poly(meth)acrylate having maleic anhydride on the terminals thereof.

From the viewpoint of obtaining a sea-island structure in which the average center of gravity distance between islands is 200 nm to 800 nm, the number average molecular weight of the block copolymer (a) able to be used in the present invention is preferably 300,000 or more and more preferably 500,000 or more. On the other hand, from the viewpoints of controlling molecular weight during synthesis and inhibiting increases in viscosity when in the form of a composition, the number average molecular weight of the block copolymer (a) is preferably 5,000,000 or less and more preferably 3,000,000 or less. The average center of gravity distance between islands increases as the number average molecular weight of the block copolymer increases.

The number average molecular weight (Mn) of the block copolymer (a) is determined according to the following method. First, measurement is carried out according to the aromatic ring-containing polymer moiety number average molecular weight measurement method described in the following section 1), followed by carrying out measurement according to the poly(meth)acrylate moiety number average molecular weight measurement method described in the following section 2). In the case the block copolymer (a) is composed only of the aromatic ring-containing polymer moiety and the poly(meth)acrylate moiety, the number average molecular weight becomes the sum of the number average molecular weights of the aromatic ring-containing polymer moiety and the poly(meth)acrylate moiety.

In the case the block copolymer (a) contains other polymer moieties in addition to the aromatic ring-containing polymer and the poly(meth)acrylate, measurement is carried out according to the number average molecular weight measurement method for other polymers described in the following section 3) after carrying out the measurement described in section 2). The number average molecular weight then becomes the sum of the number average molecular weights of the aromatic ring-containing polymer moiety, the poly(meth)acrylate moiety and the other polymer moieties.

1) Aromatic Ring-Containing Polymer Moiety Number Average Molecular Weight Measurement Method In the case of synthesizing the block copolymer (a) by living anionic polymerization, although mainly an aromatic ring-containing monomer is first polymerized followed by polymerizing an acrylic monomer from the terminals thereof, here if the reaction is stopped by removing a portion of the aromatic ring-containing monomer at the point polymerization has finished, only a portion of the aromatic ring-containing polymer can be obtained in the block copolymer. Alternatively, only a portion of the aromatic ring-containing polymer can be obtained in the block copolymer by carrying out Soxhlet extraction on the block copolymer after synthesis using a solvent that dissolves only an aromatic homopolymer without dissolving the block copolymer. Cyclohexane and the like are used for the solvent in the case of a PS-PMMA block copolymer. Elution time distribution is first measured for the aromatic homopolymer extracted in this manner using gel permeation chromatography (GPC). Next, the elution times of several types of polystyrene standards having different molecular weights are measured, and the elution times are converted to molecular weights. The number of molecules Ni of the molecular weight Mi is then determined from that result, and number average molecular weight Mn can be determined from the following equation:

$$Mn=\Sigma(MiNi)/\Sigma Ni$$

Furthermore, examples of the measurement apparatus and conditions are as indicated below.

Apparatus: Tosoh HLC-8020
Eluent: Tetrahydrofuran, 40° C.
Column: Tosoh, trade name: TSK gel G5000HHR/G4000HHR/G3000HHR/G2500HHR in series
Flow rate: 1.0 ml/min
Molecular weight calibration standards: Tosoh TSK Polystyrene Standards (12 samples)

2) Poly(meth)acrylate Moiety Number Average Molecular Weight Measurement Method

A block copolymer is dissolved in a deuteration solvent such as deuterochloroform followed by measurement of the $^1$H-NMR spectrum thereof. The molar ratio between the aromatic ring-containing polymer moiety and the poly(meth)acrylate moiety in the block copolymer is determined by comparing the number of protons derived from the aromatic ring-containing polymer and the number of protons derived from the poly(meth)acrylate. Thus, the number average molecular weight of the poly(meth)acrylate can be determined from the number average molecular weight of the aromatic ring-containing polymer moiety previously determined by GPC.

3) Number Average Molecular Weight Measurement Method for Other Polymer Moieties A block copolymer is dissolved in a deuteration solvent such as deuterochloroform followed by measurement of the $^1$H-NMR spectrum thereof. The molar ratio between the aromatic ring-containing polymer moiety and other polymer moieties in the block copolymer is determined by comparing the number of protons derived from the aromatic ring-containing polymer and the number of protons derived from the other polymer moieties. Thus, the number average molecular weight of the other polymer moieties can be determined from the number average molecular weight of the aromatic ring-containing polymer moiety previously determined by GPC.

The ratio of the total of the aromatic ring-containing polymer moiety and the poly(meth)acrylate moiety to the entire block copolymer is preferably 50 mol % or more from the viewpoint of forming a sea-island structure in which the average center of gravity distance between islands is 200 nm or more. In addition, the molar ratio of the poly(meth)acrylate moiety to the aromatic ring-containing polymer moiety in the block copolymer is preferably 1:1 or more from the viewpoint of allowing the aromatic ring-containing polymer moiety to fulfill the role of islands in the sea-island structure, and preferably 1:5 or less and more preferably 1:4 or less from the viewpoint of making the average center of gravity distance between islands to be 200 nm or more.

The average center of gravity distance between islands increases and the area average circularity coefficient of the islands decreases as the molar ratio of the poly(meth)acrylate moiety to the aromatic ring-containing polymer moiety in the block copolymer (a) approaches 1:1. Conversely, the average center of gravity distance between islands decreases and the area average circularity coefficient of the islands increases as the molar ratio of the poly(meth)acrylate moiety to the aromatic ring-containing polymer moiety in the block copolymer (a) increases.

Next, an explanation is provided of the aromatic ring-containing homopolymer (b) and the poly(meth)acrylate homopolymer (c).

Although ordinary block copolymers are able to form a sea-island structure alone, since the block copolymer used in the present invention has an extremely high molecular weight, it is difficult for this block copolymer to form a sea-island structure on its own due to the excessively high viscosity thereof. Therefore, the viscosity of the composition can be lowered to facilitate the formation of a sea-island structure by adding the aromatic ring-containing homopolymer (b) and the poly(meth)acrylate homopolymer (c), which are composed of a monomer that composes the block copolymer (a).

Controlling the proportions of the aromatic ring-containing polymer moiety and the (meth)acrylate moiety tends to make it possible to control the average center of gravity distance between islands in a sea-island structure. In the present invention, since not only the block copolymer, but also each of the homopolymers are used for the aforementioned moieties, the overall proportions of the aromatic ring-containing polymer moiety and the poly(meth)acrylate moiety are easily controlled.

Although increasing the proportion of aromatic ring-containing polymer in a resin composition was previously determined to be effective for making the average center of gravity distance between islands to be 200 nm or more, if the proportion of the aromatic ring-containing polymer is increased, pattern regularity deteriorates (see Patent Document 2), and the average circularity coefficient of the islands is only 0.6 or more, thereby resulting in the problem of the need to increase film thickness to that equal to the particle diameter of the islands (see Patent Document 3).

The weight average molecular weight (Mw) of the aromatic ring-containing homopolymer (b) is preferably 1,500 or more and more preferably 2,500 or more from the viewpoint of obtaining a sea-island structure having a well-defined contour of the island portions, while it is preferably 8,000 or less from the viewpoint of obtaining a sea-island structure in which the area average circularity coefficient is 0.7 or more, and more preferably 5,000 or less from the viewpoint of obtaining a sea-island structure in which the area average circularity coefficient is 0.8 or more.

This type of aromatic ring-containing homopolymer (b) can be synthesized by radical polymerization or anionic polymerization. In particular, the terminal group of the aromatic ring-containing homopolymer (b) is preferably an $R_1R_2(CN)C-$ group (wherein, $R_1$ and $R_2$ mutually and respectively represent a $C_1$-$C_6$ alkyl group or alkoxyalkyl group), and particularly preferably a $(CH_3)_2(CN)C-$ group, from the viewpoint of obtaining a sea-island structure in which the area average circularity coefficient is 0.8 or more, and this can be synthesized by radical polymerization using a compound in which the aforementioned terminal groups are linked by azo bonds in the manner of azobisisobutyronitrile (AIBN) as a polymerization initiator. Molecular weight can be controlled to within the preferable range of the present invention by controlling the amounts of initiator and solvent and the polymerization temperature in the case of radical polymerization, or by controlling the amounts of impurities such as water and air in the system and the amount of the initiator in the case of anionic polymerization.

The weight average molecular weight (Mw) of the aromatic ring-containing homopolymer (b) can be determined according to the method described below.

First, the elution time distribution of the aromatic ring-containing homopolymer (b) is measured using GPC. Next, the elution times of several types of polystyrene standards having different molecular weights are measured and the elution times are converted to molecular weights. The number of molecules Ni of the molecular weight. Mi is determined from this result, and the weight average molecular weight Mw can be determined from the following equation:

$$Mw=\Sigma(Mi^2Ni)/\Sigma(MiNi)$$

The weight average molecular weight of the poly(meth) acrylate homopolymer (c) is preferably 1,500 or more and more preferably 2,500 or more from the viewpoint of obtaining a sea-island structure having a well-defined contour of the island portions. On the other hand, it is preferably 14,000 or less from the viewpoint of inhibiting phase separation from the poly(meth)acrylate moiety in the block copolymer.

In addition, the terminal groups of the poly(meth)acrylate homopolymer (c) are preferably aliphatic groups from the viewpoints of obtaining a sea-island structure having a well-defined contour of the island portions. Preferable examples of aliphatic groups include $R_1R_2(CN)C-$ groups and $R_1R_2(COOCH_3)C-$ groups (wherein, $R_1$ and $R_2$ represent alkyl groups or alkoxy groups having 1 to 6 carbon atoms).

This type of poly(meth)acrylate homopolymer (c) can be synthesized by radical polymerization or anionic polymerization, and those having aliphatic groups on the terminals thereof in particular can be synthesized by using an aliphatic compound as polymerization initiator. Molecular weight can be controlled to within the preferable range of the present invention by controlling the amounts of initiator and solvent and the polymerization temperature in the case of radical polymerization, or by controlling the amounts of impurities such as water and air in the system and the amount of the initiator in the case of anionic polymerization.

The weight average molecular weight of the poly(meth) acrylate homopolymer (c) can be determined according to the method described below.

First, the elution time distribution of the aromatic ring-containing homopolymer is measured using gel permeation chromatography (GPC). Next, the elution times of several types of methyl polymethacrylate standards having different molecular weights are measured and the elution times are converted to molecular weights. The number of molecules Ni of the molecular weight Mi is determined from this result, and the weight average molecular weight Mw can be determined from the following equation:

$$Mw=\Sigma(Mi^2Ni)/\Sigma(MiNi)$$

The weight ratio of the total of the aromatic ring-containing homopolymer (b) and the poly(meth)acrylate homopolymer (c) to the total weight of the resin composition for pattern formation is preferably 10% by weight or more and more preferably 40% by weight or more from the viewpoint of obtaining a sea-island structure in which the area average circularity coefficient is 0.7 or more, and preferably 90% by weight or less and more preferably 80% by weight or less from the viewpoint of inhibiting overall uniform miscibility.

The weight ratio of the total of the aromatic ring-containing moiety contained in the block copolymer (a) as a block moiety and the aromatic ring-containing homopolymer (b) to the total weight of the resin composition for pattern formation is preferably 10% by weight or more and more preferably 20% by weight or more from the viewpoint of increasing the average center of gravity distance between islands composed of the aromatic ring-containing polymer to 200 nm or more. On the other hand, the aforementioned ratio is preferably 60% by weight or less and more preferably 50% by weight or less from the viewpoint of allowing the aromatic ring-containing polymer moiety to fulfill the role of islands in the sea-island structure. The average center of gravity distance between islands becomes larger and the area average circularity coefficient of the islands becomes smaller as the weight ratio of the total of the aromatic ring-containing polymer moiety contained in the block copolymer (a) as a block moiety and the aromatic ring-containing homopolymer (b) becomes larger in the entire resin composition.

Other components may also be added to the resin composition able to be used in the present invention in addition to those previously described provided they do not impair the formation of a sea-island structure.

The resin composition for pattern formation can be obtained in the form of a solution for pattern formation by dissolving in a solvent. Any solvent may be used for the solvent used provided it is able to dissolve the aforementioned resin composition for pattern formation, and examples thereof include N-methyl-2-pyrrolidone, N-ethyl-2-pyrrolidone, γ-butyrolactone, cyclopentanone, cyclohexanone, isophorone, N,N-dimethylacetoamide, dimethylimidazolinone, tetramethylurea, dimethylsulfoxide, diethylene glycol dimethyl ether, diethylene glycol diethyl ether, diethylene glycol dibutyl ether, propylene glycol monomethyl ether, propylene glycol monoethyl ether, dipropylene glycol monomethyl ether, propylene glycol monomethyl ether acetate (PGMEA), methyl lactate, ethyl lactate, butyl lactate, methyl-1,3-butylene glycol acetate, 1,3-butylene glycol-3-monomethyl ether and methyl-3-methoxypropionate. These can be used alone or two or more types can be mixed and used as a solvent. Preferable specific examples include N-methylpyrrolidone, cyclopentanone, cyclohexanone, γ-butyrolactone, ethyl lactate, propylene glycol monomethyl ether, propylene glycol monoethyl ether and PGMEA. The weight ratio of the resin composition to the solvent is preferably 1% by weight to 30% by weight.

Next, a description is provided of a method for forming a structure having a sea-island pattern using the resin composition for pattern formation. When forming the pattern having a sea-island structure, at least a step for obtaining a coated film by coating the aforementioned solution for pattern formation on a substrate, and a step for heating the coated film on the substrate in the presence of oxygen in that order.

Examples of methods for coating the aforementioned solution for pattern formation onto the substrate include coating with a spin coater, bar coater, blade coater, curtain coater, spray coater or inkjet method, and printing with a screen printer, gravure printer or offset printer.

Next, the solvent is evaporated by heat-drying or vacuum-drying the resulting coated film with hot air, an oven or hot plate and the like. From the viewpoint of controlling the average center of gravity distance between the islands, the film thickness after evaporating the solvent is preferably 1 µm or less, more preferably 50 nm to 1 µm and even more preferably 100 nm to 800 nm. According to the present invention, a dot pattern can be formed that demonstrates an average center of gravity distance that is considerably larger than the film thickness. Furthermore, film thickness can be determined by using a contact method in which a mark is made in the film followed by contacting terminals with the surface thereof and measuring the level difference, or a non-contact method using ellipsometry. Methods used to heat the coated film on the substrate can be broadly categorized into methods in which heat is allowed to propagate directly from beneath the substrate in the manner of a hot plate, and methods in which air at a high temperature is allowed to circulate in the manner of an oven. Allowing heat to propagate directly enables a sea-island structure to be obtained in a shorter period of time.

In the heating step, in the case of heating on a hot plate preferably over a temperature range of 130° C. to 280° C., heating is preferably carried out over a range of 1 minute to 1 hour, while in the case of heating in an oven, heating is preferably carried out over a range of 1 hour to 100 hours. Heating is also preferably carried out in an atmosphere consisting of a mixture of oxygen and an inert gas. The oxygen concentration of the atmosphere is preferably 0.05% by volume or more, and more preferably 0.1% by volume or more to enable the area circularity coefficient to reach an adequate value due to the progression of phase separation. On the other hand, the oxygen concentration is also preferably 25% by volume or less, and more preferably 15% by volume or less in order to obtain a time that facilitates control of annealing time due to the positive correlation of the relationship between pattern formation rate and oxygen concentration. Here, oxygen concentration is controlled by regulating the ratio of the flow volumes of the inert gas and the air or oxygen so that the oxygen concentration reaches a target value after mixing the inert gas and air or oxygen and supplying to a heating device such as an oven, connecting an oxygen concentration meter to the outlet of the device, and heating the heating device to the annealing temperature. A sea-island structure can be obtained in a shorter period of time the higher the oxygen concentration and the higher the heating temperature. In addition, the average center of gravity distance between islands can be easily increased the higher the oxygen concentration and the higher the heating temperature. Fluidity of the composition can be ensured and thermal decomposition can be inhibited by heating within a temperature range of 130° C. to 280° C.

<Pattern Formation Method>

In the present invention, a pattern having a sea-island structure in which the average center of gravity distance between islands is roughly equal to the wavelength of the light (for example, 200 nm to 800 nm) and the area average circularity coefficient of the islands is 0.65 or more can also be obtained by a method for forming a pattern having sea-island structure comprising the steps of:

(1) forming a thin film having a thickness of 1 µm or less by coating onto a substrate a solution of a resin composition for pattern formation comprising the following:

(a) a block copolymer (a) containing an aromatic ring-containing polymer and a poly(meth)acrylate as block moieties, wherein the number average molecular weight of the block copolymer (a) is 300,000 to 5,000,000, the ratio of the total of the aromatic ring-containing polymer moiety and the poly(meth)acrylate moiety to the entire block polymer (a) is 50 mol % or more, and the molar ratio of the aromatic ring-containing polymer moiety to the poly(meth)acrylate moiety is 1:1 to 1:5; and, as arbitrary components, (b) an aromatic ring-containing homopolymer (b) composed of a monomer that composes the aromatic ring-containing polymer contained in the block copolymer (a) as a block moiety, wherein the weight average molecular weight of the aromatic ring-containing homopolymer (b) is 1,500 to 8,000; and/or (c) a poly(meth)acrylate homopolymer (c) composed of a monomer that composes the poly(meth)acrylate contained in the block copolymer (a) as a block moiety, wherein the weight average molecular weight of the poly(meth)acrylate homopolymer (c) is 1,500 to 5,000,000; wherein, the weight ratio of the total of the aromatic ring-containing homopolymer (b) and the poly(meth)acrylate homopolymer (c) to the entire resin composition is 10% by weight to 90% by weight, and the weight ratio of the total of the aromatic ring-containing polymer moiety contained in the block copolymer (a) as a block moiety and the aromatic ring-containing homopolymer (b) to the entire resin composition is 10% by weight to 60% by weight, followed by evaporating the solvent in the solution; and, (2) heating the thin film at a temperature of 130° C. to 280° C. over a time of 1 minute to 100 hours in a mixed gas atmosphere of oxygen and an inert gas in which the oxygen concentration is 0.05% by volume to 25% by volume; wherein the pattern having a sea-island structure is a microphase separation structure in which an aromatic ring-containing polymer layer serves as the islands and a poly(meth)acrylate polymer phase serves as the sea, the average center of gravity distance between the islands is 200 nm to 800 nm, and the area average circularity coefficient of the islands is 0.65 or more.

Here, definitions of the average center of gravity distance between the islands and the area average circularity coefficient of the islands are as previously described.

Here, (meth)acrylate refers to acrylate and/or methacrylate.

The resin composition for pattern formation forms a pattern having a sea-island structure in which the aromatic ring-containing polymer moiety serves as islands and the poly (meth)acrylate moiety serves as sea by spontaneously causing phase separation between the aromatic ring-containing moiety (consisting mainly of the aromatic ring-containing polymer block moiety contained in the block copolymer (a) and the aromatic ring-containing homopolymer (b)) and the poly(meth)acrylate moiety (consisting mainly of the poly (meth)acrylate block moiety contained in the block copolymer (a) and the poly(meth)acrylate homopolymer (c)). Here, the sea-island structure refers to a structure in which a small amount of a dispersion phase (islands) are interspersed in a large amount of a continuous phase (sea) in the case of viewing the phase separation structure formed by the two types of polymers two-dimensionally. Furthermore, in the present description, the sea of the sea-island structure may also be referred to as a matrix while the islands may also be referred to as dots.

Since the aromatic ring-containing polymer moiety has higher resistance to etching than the poly(meth)acrylate moiety, an island (dot) pattern can be formed from the aromatic ring-containing polymer moiety by selectively etching only the sea moiety of the sea-island structure. A structure consisting of fine surface irregularities can then ultimately be formed on the surface of the light-emitting element by etching the underlying base by using the island pattern as a mask and then further transferring the pattern to the light-emitting element.

Next, an explanation is provided of constituent components of the resin composition for pattern formation.

First, the previously described components can be used for the block copolymer (a) and the aromatic ring-containing homopolymer (b).

Although the weight average molecular weight of the poly (meth)acrylate homopolymer (c) is preferably 5,000,000 or less from the viewpoint of obtaining a sea-island structure in which area average circularity coefficient is 0.65 or more, and the area average circularity coefficient increases as film thickness decreases, the weight average molecular weight of the poly(meth)acrylate homopolymer (c) is preferably 50,000 or less from the viewpoint of obtaining a sea-island structure in which the area average circularity coefficient is 0.65 or more regardless of the film thickness, and preferably 14,000 or less from the viewpoint of obtaining a sea-island structure in which it is 0.7 or more regardless of film thickness. In addition, the terminal groups and synthesis method of the poly (meth)acrylate homopolymer (c) that can be used are as previously described.

The weight ratio of the total of the aromatic ring-containing homopolymer (b) and the poly(meth)acrylate homopolymer (c) to the total weight of the resin composition for pattern formation is preferably 0% by weight or more from the viewpoint of obtaining a sea-island structure in which the area average circularity coefficient is 0.65 or more, and preferably 10% or more and more preferably 40% by weight or more from the viewpoint of obtaining a sea-island structure in which it is 0.7 or more. On the other hand, the aforementioned weight ratio is preferably 90% by weight or less and more preferably 80% by weight or less from the viewpoint of inhibiting overall uniform miscibility.

The weight ratio of the total of the aromatic ring-containing polymer moiety contained in the block copolymer (a) as a block moiety and the aromatic ring-containing homopolymer (b) to the total weight of the resin composition for pattern formation is the same as previously described.

Other components may also be added to the resin composition able to be used in the present invention in addition to those previously described provided they do not impair the formation of a sea-island structure.

The resin composition for pattern formation can be obtained in the form of a solution for pattern formation by dissolving in a solvent. Solvents able to be used and the weight ratio of the resin composition to the solvent able to be used are the same as previously defined.

In addition, the preferable temperature range, oxygen concentration and heating device used in the coating step and heating step of the method for forming a pattern having a sea-island structure are the same as previously described.

Next, a description is provided of an embodiment and production process of a light-emitting element.

<Form of Semiconductor Light-Emitting Element>

A light-emitting element according to the present invention refers to a semiconductor light-emitting element such as a light-emitting diode (LED) or laser diode (LD).

An embodiment of a semiconductor light-emitting element according to the present invention is as shown in FIG. 1. FIG. 1 consists of a cross-sectional view (a) and an upper overhead view (b) showing an example of the configuration of a semiconductor light-emitting element according to the present invention. As shown in FIG. 1(a), an n-type semiconductor layer (cladding layer) 2, an active layer 3, a p-type semiconductor layer (cladding layer) 4 and a current spreading layer 5 are sequentially formed on a crystal substrate 1. A p-type electrode 6 is attached to the current spreading layer 5, an n-type electrode 7 is attached to the bottom of the crystal substrate 1, and ohmic contacts are respectively formed with respect to the current spreading layer 5 and the crystal substrate 1. Although the basic configuration thus far is essentially the same as that of a conventional element, fine surface irregularities 8 are formed in the exposed surface of the current spreading layer where the electrode is not formed (see FIGS. 1(a) and 1(b)).

Examples of the semiconductor layers in the semiconductor light-emitting element include compound semiconductors such as GaP, InGaAlP, AlGaAs, GaAsP and GaN. Examples of the production processes thereof include metal organic chemical vapor deposition (MOCVD), molecular beam epitaxy (MBE), vapor phase epitaxy (VPE) and liquid phase epitaxy (LPE). Examples of crystal substrates include gallium arsenide, sapphire, silicon, silicon nitride, silicon carbide and zinc oxide. In addition, the structure of the semiconductor light-emitting element is not limited to a structure in which the upper electrode is a p-type electrode and the lower electrode is an n-type electrode, but rather a structure can conversely also be applied in which the upper electrode is an n-type electrode and the lower electrode is a p-type electrode. A buffer layer is formed between the crystal substrate and the semiconductor layer as necessary. A current spreading layer and a contact layer may also be formed between the electrode layers and the semiconductor layers as necessary. The active layer is not limited to that having a structure of a simple p-n junction, but rather may also be any known structure, such as a double hetero (DH) structure, single quantum well (SQW)

structure or multiple quantum well (MQW) structure. The material that composes the electrode layers of the semiconductor light-emitting element in the present invention is preferably a material that enables ohmic contact with a semiconductor. Specific examples thereof include a metal or alloy composed of at least one of Au, Ag, Al, Zn, Ge, Pt, Rd, Ni, Pd and Zr, and demonstrates the form of a single or multilayer structure.

<Semiconductor Light-Emitting Element Production Process>

A nanofabrication method utilizing self-assembly of materials is useful for fabricating a semiconductor light-emitting element having a structure consisting of a pattern of surface irregularities that exceeds the limiting resolution of typical lithography.

Figure 2:
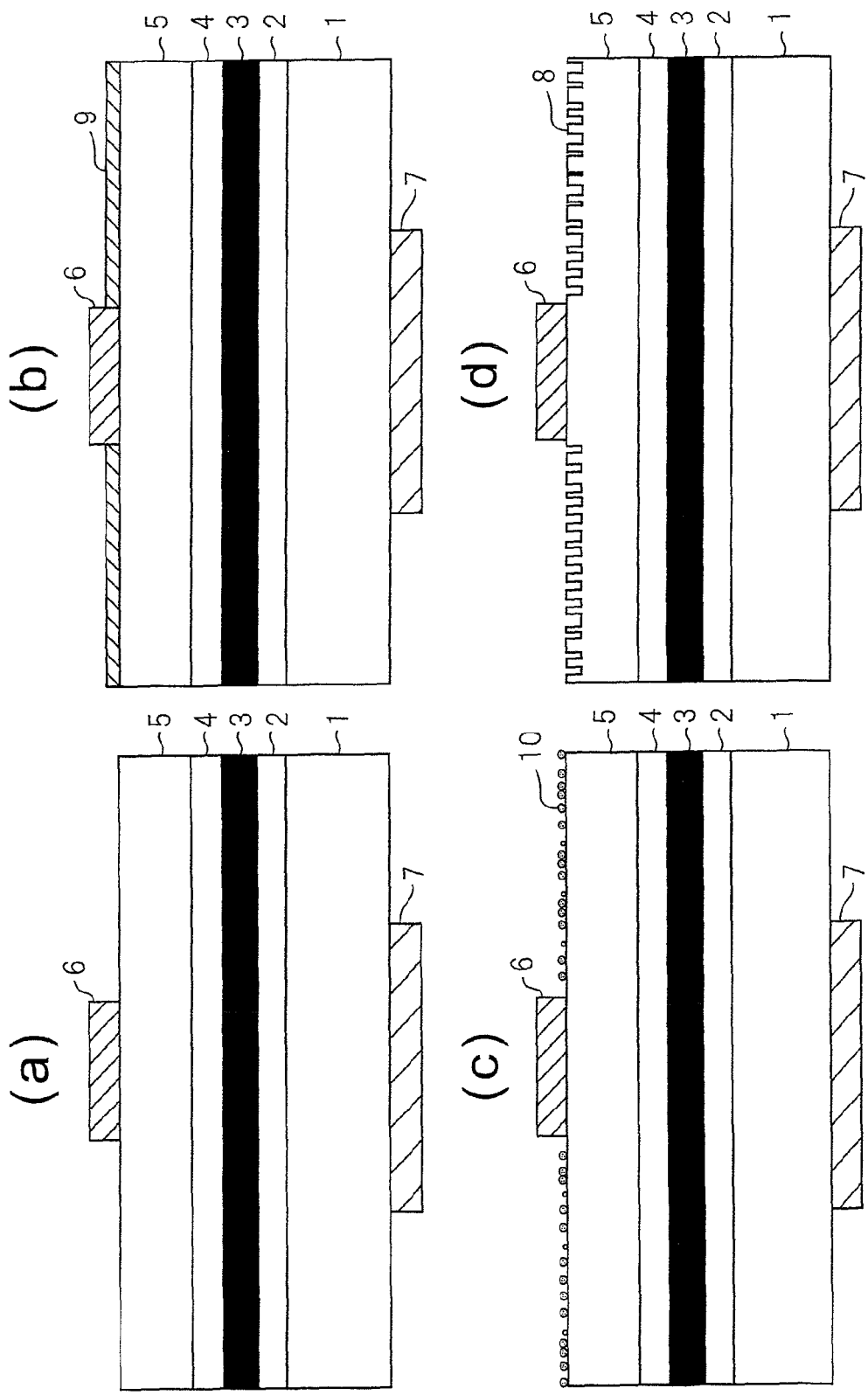
FIG. 2 is a schematic diagram of a semiconductor light-emitting element production process that uses a microphase separation pattern of the resin composition for pattern formation according to the present invention, wherein (a) depicts a structure in which a double hetero structure, a current spreading layer and electrodes are formed, (b) depicts a structure in which a block copolymer-containing resin composition film is formed on a current spreading layer, (c) depicts a structure in which a matrix portion of a phase separation pattern of a resin composition has been removed by etching, and (d) depicts a structure in which a structure consisting of surface irregularities has been formed by etching a current spreading layer by using the resin pattern obtained in (c) as a mask.

The following provides a detailed description of a production process that utilizes a microphase separation pattern of a block copolymer with reference to FIG. 2.

First, after forming a DH structure in which the active layer 3 is interposed between the cladding layers 2 and 4 on the substrate 1, the current spreading layer 5 is formed thereon followed by forming the p-side electrode 6 on the current spreading layer 5 and the n-side electrode 7 on the back side of the substrate 1 (see FIG. 2(a)).

Next, a solution obtained by dissolving a block copolymer-containing composition in an organic solvent is coated by spin coating followed by subjecting the solution to heat treatment on a hot plate until the organic solvent evaporates to form a block copolymer-containing resin composition 9 on the current spreading layer 5 (see FIG. 2(b)).

Subsequently, microphase separation is induced in the block copolymer by heat-treating (annealing) in an oven or on a hot plate at a temperature higher than the glass transition temperature of the polymer species that composes the block copolymer. In the present invention, a desired pattern is disclosed to be obtained if the oxygen concentration in the heat treatment step is at a fixed level. At this time, the resulting phase separation pattern is a dot pattern, and the polymer species that composes the dots has superior etching resistance to the polymer species that composes the matrix. Consequently, only the matrix can be removed while leaving the dots 10 by reactive ion etching (RIE) using a suitable etching gas (see FIG. 2(c)).

In addition, by continuing to carry out etching (over-etching) at this time even after removal of the matrix has been completed, the shape of the dots 10 can be shrunk (contracted), enabling connected dots to be separated and allowing the obtaining of a dot pattern having a high degree of separation.

Continuing, etching is carried out on the current spreading layer 5 serving as the underlying layer by RIE by typically using a chlorine-based gas for the etching gas and using the polymer dots 10 as a mask. The finally remaining polymer dots 10 are then removed by carrying out ashing using oxygen gas, causing a structure consisting of cylindrical surface irregularities to be formed on the surface of the current spreading layer 5, and realizing the production of a semiconductor light-emitting element according to the present invention (see FIG. 2(d)).

Furthermore, the process for production of a semiconductor light-emitting element proposed by the present invention not only enables the production of a semiconductor light-emitting element only in the order of the aforementioned steps, but also enables a semiconductor light-emitting element to be produced by a process that combines each of the aforementioned steps, such as by forming the irregular surface structure 8 on the current spreading layer 5 prior to forming the p-side electrode layer 6, followed by forming the p-side electrode layer 6.

In addition, the production process according to the present invention is able to use a pattern transfer method. Details regarding the pattern transfer method are disclosed in Patent Document 4. More specifically, since the etching selectivity of polymers and compound semiconductors is normally low, it is difficult to form an irregular surface structure having a high aspect ratio. Here, by employing a method in which the dot pattern of a block copolymer is transferred to an inorganic composition thin film by forming an inorganic composition thin film on a current spreading layer as a hard mask, forming a block copolymer-containing resin composition and inducing microphase separation, followed by RIE or a wet etching process (pattern transfer method), an irregular surface pattern having a high aspect ratio can be fabricated on the current spreading layer. Here, the inorganic composition is preferably more resistant to RIE using $O_2$, Ar and $Cl_2$ gas than the polymer species that composes the block copolymer, and examples of such materials include silicon, silicon nitride and silicon oxide deposited by sputtering, vacuum deposition or chemical vapor deposition. In addition, spin-coated siloxane polymers, polysilanes or spin-on-glass (SOG) are also effective materials.

In addition, the production process according to the present invention also enables the formation of an irregular surface structure that imparts refractive index gradient effects by carrying out sputtering using argon gas on a formed cylindrical irregular surface structure to make the convex portions sharper and form a conical, cylindrical or mesa structure. Patent Document 3 can be referred to for the details thereof.

EXAMPLES

The following provides an explanation of the present invention based on examples thereof.

First, synthesis examples are respectively indicated for the block copolymer (a), the aromatic ring-containing homopolymer (b) and the poly(meth)acrylate homopolymer (c).

Synthesis of Block Copolymer (a)

Synthesis Example 1

980 g of dehydrated and degassed tetrahydrofuran (THF) as solvent, 0.8 mL of a hexane solution of n-butyl lithium (n-BuLi) as initiator (approx. 0.16 mol/L), and 20 g of dehydrated and degassed styrene as monomer were placed in a 2 L flask followed by stirring for 30 minutes while cooling to −78° C. in a nitrogen atmosphere, adding 34 g of dehydrated and degassed methyl methacrylate as a second monomer and stirring for 4 hours. Subsequently, the reaction solution was added to a container containing 3 L of denatured alcohol (Solmix AP-1, Japan Alcohol Trading) while stirring, and the precipitated polymer was vacuum-dried overnight at room temperature.

The dried polymer was filled into a Soxhlet extractor and a by-product was extracted using cyclohexane as solvent. This by-product was identified as polystyrene having a number average molecular weight (Mn) of 366,000 on the basis of nuclear magnetic resonance (NMR) and GPC analyses.

The GPC apparatus, column and polystyrene standards used were as described below.
Apparatus: Tosoh HLC-8020
Eluent: Tetrahydrofuran, 40° C.

Column: Tosoh, trade name: TSK gel G5000HHR/G4000HHR/G3000HHR/G2500HHR in series Flow rate: 1.0 ml/min Molecular weight calibration standards: Tosoh TSK Polystyrene Standards (12 samples)

In addition, the ratio of the PS moiety to the PMMA moiety of the block copolymer was determined to be 2.13 based on the results of nuclear magnetic resonance (NMR) analysis. The NMR apparatus and solvent used were as indicated below.

Apparatus: JEOL Model JNM-GSX-400 FT-NMR

Solvent: Deuterochloroform

The main product in the form of the block copolymer was identified to have a Mn of the PS moiety of 366,000 and an Mn of the PMMA moiety of 778,000 in conjunction with the results of GPC. This was designated as BC-1.

Synthesis Example 2

Synthesis and characterization of the block copolymer were carried out in the same manner as Synthesis Example 1 with the exception of changing the amount of dehydrated and degassed methyl methacrylate added as the second monomer to 20 g. As a result, the resulting block copolymer was identified as having an Mn of the PS moiety of 292,000 and an Mn of the PMMA moiety of 324,000. This was designated as BC-2.

Synthesis Example 3

Synthesis and characterization of the block copolymer were carried out in the same manner as Synthesis Example 1 with the exception of changing the amount of dehydrated and degassed methyl methacrylate added as the second monomer to 80 g. As a result, the resulting block copolymer was identified as having an Mn of the PS moiety of 241,000 and an Mn of the PMMA moiety of 1,138,000. This was designated as BC-3.

Synthesis Example 4

Synthesis and characterization of the block copolymer were carried out in the same manner as Synthesis Example 1 with the exception of changing the amount of n-BuLi added as initiator to 0.3 mL of hexane solution (approx. 1.6 mol/L) and changing the amount of dehydrated and degassed methyl methacrylate added as the second monomer to 70 g. As a result, the resulting block copolymer was identified as having an Mn of the PS moiety of 40,000 and an Mn of the PMMA moiety of 148,000. This was designated as BC-4.

Block Copolymers synthesized in Synthesis Examples 1 to 4 are shown in the following Table 1.

TABLE 1

Synthesized Block Copolymers

| No. | Mn/10,000 | | | PS:PMMA molar ratio |
|---|---|---|---|---|
| | PS | PMMA | Total | |
| BC-1 | 36.6 | 77.8 | 114.4 | 1:2.1 |
| BC-2 | 29.2 | 32.4 | 61.6 | 1:1.1 |
| BC-3 | 24.1 | 113.8 | 137.9 | 1:4.7 |
| BC-4 | 4.0 | 14.8 | 18.8 | 1:3.7 |

Synthesis of Aromatic Ring-Containing Homopolymer (b)

Synthesis Example 5

180 g of methyl ethyl ketone (MEK) as solvent, 2.36 g (0.0144 mol) of AIBN as initiator and 30.0 g (0.288 mol) of styrene as monomer were placed in a 500 mL flask followed by stirring for 6 hours while heating to 70° C. in the presence of flowing nitrogen and allowing to cool on standing to room temperature. This reaction mixture was then added to a 2 L of mixed solution of Solmix AP-1 and water having a weight ratio of 2:1 while stirring to precipitate a polymer. After stirring this reaction solution for 1 hour, the reaction solution was filtered using filter paper and the solid fraction was vacuum-dried overnight. As a result of measuring molecular weight and molecular weight distribution by GPC under the same conditions as in the case of the block copolymer, the weight average molecular weight (Mw) was 3,200 and the molecular weight distribution (Mw/Mn) was 1.38. This was designated as PS-1.

Synthesis Example 6

Synthesis and characterization of polystyrene were carried out in the same manner as Synthesis Example 5 with the exception of changing the amount of AIBN added as initiator to 0.71 g (0.00432 mol) to obtain polystyrene having a weight average molecular weight (Mw) of 6,000 and a molecular weight distribution (Mw/Mn) of 1.47. This was designated as PS-2.

Synthesis Example 7

Synthesis and characterization of polystyrene were carried out in the same manner as Synthesis Example 5 with the exception of changing the amount of AIBN added as initiator to 0.24 g (0.00144 mol) to obtain polystyrene having a weight average molecular weight (Mw) of 11,500 and a molecular weight distribution (Mw/Mn) of 1.49. This was designated as PS-3.

Synthesis Example 8

Synthesis and characterization of polystyrene were carried out in the same manner as Synthesis Example 5 with the exception of adding 3.32 g (0.0144 mol) of 2,2'-azobis (isodimethylbutyrate) instead of AIBN as initiator to obtain polystyrene having a weight average molecular weight (Mw) of 3,400 and a molecular weight distribution (Mw/Mn) of 1.38. This was designated as PS-4.

Synthesis Example 9

50 ml of dehydrated and degassed cyclohexane and 2.6 ml of dehydrated and degassed tetrahydrofuran as solvent, 9.0 g (0.0864 mol) of dehydrated and degassed styrene as monomer, and 2 mL of a hexane solution of n-BuLi as initiator (approx. 1.59 mol/L) were added to a flask followed by stirring for 3 hours at 25° C. in the presence of nitrogen and adding methanol to the solution while stirring to precipitate a polymer. After stirring this reaction solution for 1 hour, the reaction solution was filtered using filter paper and the solid fraction was vacuum-dried overnight. As a result of measuring molecular weight and molecular weight distribution by GPC under the same conditions as in the case of the block copolymer, polystyrene was obtained in which the weight average molecular weight (Mw) was 2,800 and the molecular weight distribution (Mw/Mn) was 1.03. This was designated as PS-5.

Polystyrenes synthesized in Synthesis Examples 5 to 9 are shown in the following Table 2.

TABLE 2

| Synthesized Polystyrenes | | | |
|---|---|---|---|
| No. | Terminal Group | Mw | Mw/Mn |
| PS-1 | Isobutyronitrile | 3,200 | 1.38 |
| PS-2 | " | 6,000 | 1.47 |
| PS-3 | " | 11,500 | 1.49 |
| PS-4 | Dimethylisobutyrate | 3,400 | 1.38 |
| PS-5 | n-butyl | 2,800 | 1.03 |

Synthesis of Poly(meth)acrylate Homopolymer (c)

Synthesis Example 10

390 g of MEK as solvent, 37.4 g (0.16 mol) of 2,2'-azobis (dimethylisobutyrate) as initiator, and 65 g (0.65 mol) of methyl methacrylate as monomer were placed in 1 L flask followed by stirring for 5 hours while heating to 70° C. in the presence of flowing nitrogen and cooling to room temperature on standing.

This reaction mixture was then added to 3 L of hexane while stirring to precipitate a polymer. After stirring this reaction solution for 1 hour, the reaction solution was filtered using filter paper and the solid component was vacuum-dried overnight at room temperature. As a result of measuring molecular weight and molecular weight distribution by GPC, the molecular weight (Mw) was 4,000 and the molecular weight distribution (Mw/Mn) was 1.70 (furthermore, although measurements were made by GPC in the same manner as in the case of the block copolymer at this time, PMMA standard M-H-10 manufactured by Polymer Laboratories was used for the molecular weight calibration standard). This was designated as PMMA-1.

Synthesis Example 11

Synthesis and characterization of poly(methyl methacrylate) were carried out in the same manner as Synthesis Example 10 with the exception of changing the amount of 2,2'-azobis(dimethylisobutyrate) added as initiator to 15.0 g (0.065 mol) to obtain poly(methyl methacrylate) having a molecular weight (Mw) of 11,800 and a molecular weight distribution (Mw/Mn) of 1.80. This was designated as PMMA-2.

Synthesis Example 12

Synthesis and characterization of poly(methyl methacrylate) were carried out in the same manner as Synthesis Example 10 with the exception of changing the initiator to 2,2'-azobis(dimethylisobutyrate) and adding 26.7 g (0.16 mol) of AIBN to obtain poly(methyl methacrylate) having a molecular weight (Mw) of 3,600 and a molecular weight distribution (Mw/Mn) of 1.72. This was designated as PMMA-3.

In addition, as a result of purchasing poly(methyl methacrylates) from Aldrich and Wako Pure Chemical Industries and similarly measuring the molecular weights and molecular weight distributions thereof, the Aldrich product had a weight average molecular weight (Mw) of 14,500 and molecular weight distribution (Mw/Mn) of 1.44, while the Wako Pure Chemical Industry product had a weight average molecular weight (Mw) of 107,000 and molecular weight distribution (Mw/Mn) of 1.50. These were respectively designated as PMMA-4 and PMMA-5.

Poly(methyl methacrylates) synthesized in Synthesis Examples 10 to 12 and the purchased poly(methyl methacrylates) are shown in the following Table 3.

TABLE 3

| Synthesized or Purchased Poly(methyl methacrylates) | | | |
|---|---|---|---|
| No. | Terminal Group | Mw | Mw/Mn |
| PMMA-1 | Dimethylisobutyrate | 4,000 | 1.70 |
| PMMA-2 | " | 11,800 | 1.80 |
| PMMA-3 | Isobutyronitrile | 3,600 | 1.72 |
| PMMA-4 | " | 14,500 | 1.44 |
| PMMA-5 | " | 107,700 | 1.50 |

The following indicates examples of forming a pattern having a sea-island structure by combining block copolymers, polystyrenes and poly(methyl methacrylates) synthesized in the present invention.

Example 1

4% by weight PGMEA solutions of the BC-1, PS-1 and PMMA-1 synthesized in the previous synthesis examples were prepared, and a solution was prepared by mixing 15 g of the resulting BC-1 solution, 7.5 g of the PS-1 solution and 15 g of the PMMA-1 solution. This solution was then spin-coated onto a silicon wafer for 30 seconds at 1130 rpm followed by pre-baking for 90 seconds at 110° C. to form a thin film. The film thickness of this thin film was found to be 250 nm when measured using the Nanospec AFT3000T manufactured by Nanometrics Japan. Next, a gas was allowed to flow into a curing oven (Koyo Thermo Systems, Model CHL-21CD-S) at a ratio of nitrogen at 90 L/min and air at 1 L/min, the oven was initially heated to 250° C., and the flow rates of the nitrogen and air were finely adjusted so that the oxygen concentration in the oven was 0.2% by volume. (Oxygen concentration was measured using the Model LC-700L oxygen concentration meter manufactured by Toray Engineering.) Subsequently, the oven was allowed to cool to room temperature, the wafer coated with the aforementioned resist was placed in the oven without changing the nitrogen and air flow rates, and the wafer was heated for 8 hours at 250° C. followed by allowing to cool to room temperature, removing from the oven, carrying out $O_2$ plasma etching on the wafer with the EXAM plasma etching system (Shinko Seiki) at a pressure of 30 Pa and power output of 133 W, and observing the surface thereof with the S-4800 field-emission scanning electron microscope (FE-SEM) (Hitachi High-Technologies) to confirm the formation of a pattern having a sea-island structure. This pattern having a sea-island structure consisted of a polystyrene moiety for the islands and a poly(methyl methacrylate) moiety for the sea.

When this pattern having a sea-island structure was analyzed using A-ZO KUN image analysis software (available from Asahi Kasei Engineering), the average center of gravity distance between islands was 290 nm and the area average circularity coefficient of the islands was 0.95.

Example 2

Spin coating and pre-baking were carried out in the same manner as Example 1 with the exception of changing the concentrations of each of the PGMEA solutions of BC-1, PS-1 and PMMA-1 from 4% by weight to 5% by weight to form a thin film having a film thickness of 400 nm on a wafer. Next, a pattern having a sea-island structure was formed on the wafer by heating the thin film in the same manner as Example 1. The average center of gravity distance between islands at this time as measured using the same method as Example 1 was 450 nm, and the area average circularity coefficient of the islands was 0.92.

Example 3

The same procedure as Example 1 was carried out with the exception of changing the added amount of the each of the 4% by weight PGMEA solutions of BC-1, PS-1 and PMMA-1 to 12 g, 9 g and 18 g, respectively, to form a pattern having a sea-island structure on a wafer. The average center of gravity distance between islands at this time as measured using the same method as Example 1 was 430 nm, and the area average circularity coefficient of the islands was 0.91.

Example 4

The same procedure as Example 1 was carried out with the exception of changing the added amount of the each of the 4% by weight PGMEA solutions of BC-1, PS-1 and PMMA-1 to 18 g, 11.25 g and 12 g, respectively, to form a pattern having a sea-island structure on a wafer. The average center of gravity distance between islands at this time as measured using the same method as Example 1 was 570 nm, and the area average circularity coefficient of the islands was 0.88.

Example 5

The same procedure as Example 1 was carried out with the exception of changing the added amount of the each of the 4% by weight PGMEA solutions of BC-1, PS-1 and PMMA-1 to 18 g, 6 g and 12 g, respectively, to form a pattern having a sea-island structure on a wafer. The average center of gravity distance between islands at this time as measured using the same method as Example 1 was 250 nm, and the area average circularity coefficient of the islands was 0.96.

Example 6

The same procedure as Example 1 was carried out with the exception of changing the added amount of the each of the 4% by weight PGMEA solutions of BC-1, PS-1 and PMMA-1 to 15 g, 9 g and 15 g, respectively, to form a pattern having a sea-island structure on a wafer. The average center of gravity distance between islands at this time as measured using the same method as Example 1 was 320 nm, and the area average circularity coefficient of the islands was 0.94.

Example 7

The same procedure as Example 1 was carried out with the exception of changing the added amount of the each of the 4% by weight PGMEA solutions of BC-1, PS-1 and PMMA-1 to 18 g, 10.5 g and 12 g, respectively, to form a pattern having a sea-island structure on a wafer. The average center of gravity distance between islands at this time as measured using the same method as Example 1 was 470 nm, and the area average circularity coefficient of the islands was 0.90.

Example 8

The same procedure as Example 1 was carried out with the exception of carrying out spin coating using only 40 g of the 4% by weight PGMEA solution of BC-1 to form a pattern having a sea-island structure on a wafer. The average center of gravity distance between islands at this time as measured using the same method as Example 1 was 310 nm, and the area average circularity coefficient of the islands was 0.65.

Example 9

The same procedure as Example 1 was carried out with the exception of changing the added amount of the each of the 4% by weight PGMEA solutions of BC-1 and PMMA-1 to 30 g and 7.5 g, respectively, to form a pattern having a sea-island structure on a wafer. The average center of gravity distance between islands at this time as measured using the same method as Example 1 was 230 nm, and the area average circularity coefficient of the islands was 0.68.

Example 10

The same procedure as Example 1 was carried out with the exception of changing the added amount of the each of the 4% by weight PGMEA solutions of BC-1 and PS-1 to 30 g and 6 g, respectively, to form a pattern having a sea-island structure on a wafer. The average center of gravity distance between islands at this time as measured using the same method as Example 1 was 490 nm, and the area average circularity coefficient of the islands was 0.66.

Example 11

Spin coating and pre-baking were carried out in the same manner as Example 1 with the exception of changing the added amounts of each of the 4% by weight PGMEA solutions of BC-1, PS-1 and PMMA-1 to 18 g, 7.5 g and 12 g, respectively, to form a thin film having a film thickness of 250 nm on a wafer. Next, the wafer was placed in a curing oven (Koyo Thermo Systems, Model CHL-21CD-S), gas was allowed to flow in at a ratio of nitrogen at 120 L/min and air at 1 L/min, the oxygen concentration in the oven was adjusted to 0.1% by volume, and the wafer was heated for 8 hours at 250° C. to form a pattern having a sea-island structure on the wafer. The average center of gravity distance between islands at this time as measured using the same method as Example 1 was 330 nm, and the area average circularity coefficient of the islands was 0.93.

Example 12

An experiment was carried out in the same manner as Example 11 with the exception of changing the gas flow rates during curing to a ratio of nitrogen at 90 L/min and air at 1 L/min so that the oxygen concentration in the oven was 0.2% by volume to form a pattern having a sea-island structure on a wafer. The average center of gravity distance between islands at this time as measured using the same method as Example 1 was 340 nm, and the area average circularity coefficient of the islands was 0.94.

Example 13

An experiment was carried out in the same manner as Example 11 with the exception of changing the gas flow rates during curing to a ratio of nitrogen at 90 L/min and air at 5 L/min so that the oxygen concentration in the oven was 1.3% by volume to form a pattern having a sea-island structure on a wafer. The average center of gravity distance between islands at this time as measured using the same method as Example 1 was 490 nm, and the area average circularity coefficient of the islands was 0.91.

Example 14

An experiment was carried out in the same manner as Example 11 with the exception of changing the gas flow rates during curing to a ratio of nitrogen at 75 L/min and air at 25 L/min so that the oxygen concentration in the oven was 5.3% by volume to form a pattern having a sea-island structure on a wafer. The average center of gravity distance between islands at this time as measured using the same method as Example 1 was 573 nm, and the area average circularity coefficient of the islands was 0.89.

Example 15

An experiment was carried out in the same manner as Example 11 with the exception of using only air at a flow rate of 100 L/min for the gas during curing to form a pattern having a sea-island structure on a wafer. The oxygen concentration inside the oven was measured to be 20.7% by volume. The average center of gravity distance between islands at this time as measured using the same method as Example 1 was 678 nm, and the area average circularity coefficient of the islands was 0.88.

Example 16

Although a pattern having a sea-island structure was attempted to be formed on a wafer by carrying out an experiment in the same manner as Example 11 with the exception of changing the ratio of the gas flow rates during curing to nitrogen at 240 L/min and air at 0.5 L/min so that the oxygen concentration in the oven was 0.025% by volume, the resulting resist formed a continuous phase for both the PS moiety and PMMA moiety under these conditions and a pattern having a sea-island structure was not formed. When the annealing time at 250° C. was instead extended to 96 hours, a pattern having a sea-island structure was formed on the wafer. The average center of gravity distance between islands at this time as measured using the same method as Example 1 was 330 nm, and the area average circularity coefficient of the islands was 0.93.

Example 17

Spin coating and pre-baking were carried out in the same manner as Example 11 to form a thin film having a film thickness of 250 nm on a wafer. Next, this wafer was heated for 30 minutes in air by placing on a hot plate at 230° C. This wafer was then subjected to $O_2$ plasma etching with the EXAM plasma etching system (Shinko Seiki) at a pressure of 30 Pa and power output of 133 W, and when the surface thereof was observed with the S-4800 field-emission scanning electron microscope (FE-SEM) (Hitachi High-Technologies), a pattern having a sea-island structure was confirmed to have been formed. When this pattern having a sea-island structure was analyzed using A-ZO KUN image analysis software (available from Asahi Kasei Engineering), the average center of gravity distance between islands was 750 nm and the area average circularity coefficient of the islands was 0.88.

Example 18

An experiment was conducted in the same manner as Example 17 with the exception of using PS-2 instead of PS-1 to form a pattern having a sea-island structure on a wafer. The average center of gravity distance between islands at this time as measured using the same method as Example 17 was 536 nm, and the area average circularity coefficient of the islands was 0.72.

Example 19

An experiment was conducted in the same manner as Example 17 with the exception of using PS-4 instead of PS-1 to form a pattern having a sea-island structure on a wafer. The average center of gravity distance between islands at this time as measured using the same method as Example 17 was 500 nm, and the area average circularity coefficient of the islands was 0.75.

Example 20

An experiment was conducted in the same manner as Example 17 with the exception of using PS-5 instead of PS-1 to form a pattern having a sea-island structure on a wafer. The average center of gravity distance between islands at this time as measured using the same method as Example 17 was 777 nm, and the area average circularity coefficient of the islands was 0.74.

Example 21

The same procedure as Example 1 was carried out with the exception of using PMMA-2 instead of PMMA-1 and changing the added amount of the each of the 4% by weight PGMEA solutions of BC-1, PS-2 and PMMA-2 to 18 g, 9 g and 12 g, respectively, to form a pattern having a sea-island structure on a wafer. The average center of gravity distance between islands at this time as measured using the same method as Example 1 was 480 nm, and the area average circularity coefficient of the islands was 0.95.

Example 22

The same procedure as Example 21 was carried out with the exception of using PMMA-3 instead of PMMA-1 and changing the added amount of the each of the 4% by weight PGMEA solutions of BC-1, PS-2 and PMMA-3 to 18 g, 9 g and 12 g, respectively, to form a pattern having a sea-island structure on a wafer. The average center of gravity distance between islands at this time as measured using the same method as Example 1 was 450 nm, and the area average circularity coefficient of the islands was 0.95.

Example 23

The same procedure as Example 21 was carried out with the exception of using PMMA-4 instead of PMMA-1 to form a pattern having a sea-island structure on a wafer. The average center of gravity distance between islands at this time as measured using the same method as Example 17 was 400 nm, and the area average circularity coefficient of the islands was 0.70.

Example 24

Spin coating and pre-baking were carried out in the same manner as Example 11 with the exception of using PMMA-5 instead of PMMA-1 and changing the concentrations of each of the PGMEA solutions from 4% by weight to 3% by weight to form a thin film having a film thickness of 120 nm on a wafer. Next, the same procedure as Example 17 was carried out to form a pattern having a sea-island structure on a wafer. The average center of gravity distance between islands at this time as measured using the same method as Example 17 was 280 nm, and the area average circularity coefficient of the islands was 0.65.

Example 25

The same procedure as Example 1 was carried out with the exception of using BC-2 instead of BC-1 and changing the added amount of the each of the 4% by weight PGMEA solutions of BC-2, PS-1 and PMMA-1 to 18 g, 3 g and 12 g, respectively, to form a pattern having a sea-island structure on a wafer. The average center of gravity distance between islands at this time as measured using the same method as Example 1 was 400 nm, and the area average circularity coefficient of the islands was 0.94.

Example 26

The same procedure as Example 1 was carried out with the exception of using BC-3 instead of BC-1 and changing the added amount of the each of the 4% by weight PGMEA solutions of BC-3, PS-1 and PMMA-1 to 18 g, 6 g and 12 g, respectively, to form a pattern having a sea-island structure on a wafer. The average center of gravity distance between islands at this time as measured using the same method as Example 1 was 200 nm, and the area average circularity coefficient of the islands was 0.96.

Example 27

The same procedure as Example 1 was carried out with the exception of preparing a solution mixed so that the added amount of each 5% by weight PGMEA solution of BC-1, PS-1 and PMMA-1 was 15 g, 7.5 g and 15 g, respectively, and changing the rotating speed during spin coating onto a silicon wafer to 1800 rpm to prepare a pattern having a sea-island structure on the wafer. The average center of gravity distance between islands at this time as measured using the same method as Example 1 was 290 nm, and the area average circularity coefficient of the islands was 0.95.

Example 28

The same procedure as Example 1 was carried out with the exception of respectively using 4% by weight N-methylpyrrolidone solutions of BC-1, PS-1 and PMMA-1 to form a pattern having a sea-island structure on a wafer. The average center of gravity distance between islands at this time as measured using the same method as Example 1 was 290 nm, and the area average circularity coefficient of the islands was 0.95.

Example 29

The same procedure as Example 1 was carried out with the exception of respectively using 4% by weight γ-butyrolactone solutions of BC-1, PS-1 and PMMA-1 to form a pattern having a sea-island structure on a wafer. The average center of gravity distance between islands at this time as measured using the same method as Example 1 was 290 nm, and the area average circularity coefficient of the islands was 0.95.

Comparative Example 1

The same procedure as Example 1 was carried out with the exception of respectively using BC-4 instead of BC-1 and changing the added amounts of each of the 4% by weight PGMEA solutions of BC-4, PS-1 and PMMA-1 to 18 g, 6 g and 12 g, respectively, to form a sea-island pattern on a wafer. The average center of gravity distance between islands at this time as measured using the same method as Example 1 was 140 nm, and the area average circularity coefficient of the islands was 0.95.

Comparative Example 2

The same procedure as Example 11 was carried out with the exception of using PS-3 instead of PS-1. The area average circularity coefficient of the resulting pattern having a sea-island structure at that time was excessively low at less than 0.5, and the average center of gravity distance between islands was unable to be measured.

Comparative Example 3

The same procedure as Example 1 was carried out with the exception of changing the added amounts of each of the 4% by weight PGMEA solutions of BC-1 and PS-1 to 12 g and 12 g, respectively, to form a sea-island pattern on a wafer. The average center of gravity distance between islands at this time as measured using the same method as Example 1 was 950 nm, and the area average circularity coefficient of the islands was 0.52.

Comparative Example 4

Spin-coating was carried out in the same manner as Example 1 with the exception of using PMMA-4 instead of PMMA-1 to form a thin film on a wafer. The film thickness of this thin film was found to be 250 nm when measured using the Nanospec AFT3000T manufactured by Nanometrics Japan. Next, a gas was allowed to flow into a curing oven (Koyo Thermo Systems, Model CHL-21CD-S) at a nitrogen flow rate of 90 L/min, and the oxygen concentration in the oven was made to be 5 ppm or less. (Oxygen concentration was measured using the Model LC-700L oxygen concentration meter manufactured by Toray Engineering.) Subsequently, the oven was allowed to cool to room temperature, the wafer coated with the aforementioned resist was placed in the oven, and the wafer was heated for 8 hours at 250° C. followed by allowing to cool to room temperature, removing from the oven, and carrying out $O_2$ plasma etching on the wafer with the EXAM plasma etching system (Shinko Seiki) at a pressure of 30 Pa and power output of 133 W. When the surface thereof was observed with the S-4800 field-emission scanning electron microscope (FE-SEM) (Hitachi High-Technologies), a pattern having a sea-island structure was confirmed to have been formed. This pattern having a sea-island structure consisted of a polystyrene moiety for the islands and a poly(methyl methacrylate) moiety for the sea.

When this pattern having a sea-island structure was analyzed using A-ZO KUN image analysis software (available from Asahi Kasei Engineering), the average center of gravity distance between islands was 290 nm and the area average circularity coefficient of the islands was 0.60.

The results for Examples 1 to 29 and Comparative Examples 1 to 4 are summarized in the following Table 4.

TABLE 4

Composition of Resin Composition, Annealing Conditions and Analysis Results of Sea-Island Pattern Formed

| Example No. | BC No. | BC Added Amt. (g) | PS No. | PS Added Amt. (g) | PMMA No. | PMMA Added Amt. (g) | Solvent*1 Added Amt. (g) | Total Homo-polymer*2 Wt % | Total Aromatic Ring-Containing Polymer Moiety*3 Wt % | Annealing Oxygen Concentration Vol % | Sea-Island Structure Pattern Avg. center of gravity distance (nm) | Area avg. circularity coeffcient |
|---|---|---|---|---|---|---|---|---|---|---|---|---|
| Ex. 1 | BC-1 | 0.60 | PS-1 | 0.30 | PMMA-1 | 0.60 | 36.00 | 60 | 33 | 0.2 | 290 | 0.95 |
| Ex. 2*4 | " | 0.75 | " | 0.38 | " | 0.75 | 35.63 | " | " | " | 450 | 0.92 |
| Ex. 3 | " | 0.48 | " | 0.36 | " | 0.72 | 37.44 | 69 | 33 | " | 430 | 0.91 |
| Ex. 4 | " | 0.72 | " | 0.45 | " | 0.48 | 39.60 | 56 | 41 | " | 570 | 0.88 |
| Ex. 5 | " | " | " | 0.24 | " | " | 34.56 | 50 | 33 | " | 250 | 0.96 |
| Ex. 6 | " | 0.60 | " | 0.36 | " | 0.60 | 37.44 | 62 | 35 | " | 320 | 0.94 |
| Ex. 7 | " | 0.72 | " | 0.42 | " | 0.48 | 38.88 | 56 | 40 | " | 470 | 0.90 |
| Ex. 8 | " | 1.60 | " | 0 | " | 0 | 38.40 | 0 | 32 | " | 310 | 0.65 |
| Ex. 9 | " | 1.20 | " | 0 | " | 0.30 | 36.00 | 25 | 26 | " | 230 | 0.68 |
| Ex. 10 | " | " | " | 0.24 | " | 0 | 34.56 | 17 | 44 | " | 490 | 0.66 |
| Ex. 11 | " | " | " | 0.30 | " | " | 36.00 | 52 | 35 | 0.1 | 330 | 0.93 |
| Ex. 12 | " | " | " | " | " | " | " | " | " | 0.2 | 340 | 0.94 |
| Ex. 13 | " | " | " | " | " | " | " | " | " | 1.3 | 490 | 0.91 |
| Ex. 14 | " | " | " | " | " | " | " | " | " | 5.3 | 573 | 0.89 |
| Ex. 15 | " | " | " | " | " | " | " | " | " | 20.7 | 678 | 0.88 |
| Ex. 16 | " | " | " | " | " | " | " | " | " | 0.025*5 | 330 | 0.93 |
| Ex. 17 | " | " | " | " | " | " | " | " | " | Air*6 | 750 | 0.88 |
| Ex. 18 | " | " | PS-2 | " | " | " | " | " | " | " | 536 | 0.72 |
| Ex. 19 | " | " | PS-4 | " | " | " | " | " | " | " | 500 | 0.75 |
| Ex. 20 | " | " | PS-5 | " | " | " | " | " | " | " | 777 | 0.74 |
| Ex. 21 | " | " | PS-1 | " | PMMA-2 | " | " | " | " | 0.2 | 480 | 0.95 |
| Ex. 22 | " | " | " | " | PMMA-3 | " | " | " | " | " | 450 | " |
| Ex. 23 | " | " | " | " | PMMA-4 | " | " | " | " | " | 400 | 0.70 |
| Ex. 24*4 | " | " | " | " | PMMA-5 | " | " | " | " | Air*6 | 280 | 0.65 |
| Ex. 25 | BC-2 | " | " | 0.12 | PMMA-1 | " | 31.68 | 45 | " | " | 400 | 0.94 |
| Ex. 26 | BC-3 | " | " | 0.24 | " | " | 34.56 | 50 | 25 | " | 200 | 0.96 |
| Ex. 27 | BC-1 | 0.75 | " | 0.375 | " | 0.75 | 35.63 | 60 | 33 | " | 290 | 0.95 |
| Ex. 28 | " | 0.60 | " | 0.30 | " | 0.60 | 36*7 | " | " | " | " | " |
| Ex. 29 | " | " | " | " | " | " | 36*8 | " | " | " | " | " |
| Comp. Ex. 1 | BC-4 | 0.72 | " | 0.24 | " | 0.48 | 34.56 | 50 | 27 | " | 140 | " |
| Comp. Ex. 2 | BC-1 | " | PS-3 | 0.30 | " | " | 36.00 | 52 | 35 | " | *9 | <0.5 |
| Comp. Ex. 3 | " | 0.48 | PS-1 | 0.48 | PMMA-1 | 0 | 23.04 | 50 | 66 | " | 950 | 0.52 |
| Comp. Ex. 4 | " | 0.60 | " | 0.30 | PMMA-4 | 0.60 | 36.00 | 60 | 33 | *10 | 290 | 0.60 |

*1PGMEA except for Examples 22 and 23.
*2Weight ratio of total of aromatic ring-containing homopolymer (b) and poly(meth)acrylate homopolymer (c) in entire resin composition
*3Weight ratio of total of aromatic ring-containing polymer moiety contained as block moiety in block copolymer (a) and aromatic ring-containing homopolymer (b) in entire resin composition
*4Film thickness after pre-baking: 400 nm in Example 2, 120 nm in Example 24, 250 nm in all other examples
*5Annealing carried out for 96 hours
*6Annealed on a hot plate in air
*7N-methylpyrrolidone used as solvent
*8γ-butyrolactone used as solvent
*9: Unable to be measured accurately due to excessively low area average circularity coefficient
*10: Oxygen concentration 5 ppm or less Example 30

In the present example, surface irregularities were formed on the light extraction surface of a light-emitting diode element (LED) having an emission wavelength of 635 nm using the solution prepared in Example 1.

First, a description is provided of the configuration of the LED used.

n-GaAs was used for the crystal substrate. An n-$In_{0.5}(Ga_{0.3}Al_{0.7})_{0.5}P$ layer was then formed thereon by metal organic chemical vapor deposition (MOCVD). Next, $In_{0.5}(Ga_{0.8}Al_{0.2})_{0.5}P$ was grown thereon as an active layer, and p-$In_{0.5}(Ga_{0.3}Al_{0.7})_{0.5}P$ was further grown thereon as a p-type semiconductor layer. Moreover, p-GaP was further grown as a current spreading layer to form an LED having a double hetero structure.

Continuing, after depositing an Au thin film on the entire lower surface of the n-GaAs substrate by vacuum deposition, an AuGe alloy thin film was deposited to form an n-side electrode layer. In addition, an Au thin film and AuZn alloy thin film were sequentially formed on the current spreading layer by vacuum deposition to form a p-side electrode layer. Subsequently, after processing the n-side and p-side electrode layers into desired shapes, ohmic contacts were formed at the interfaces of the n-side electrode layer/n-type GaAs substrate and the p-GaP/p-side electrode layer by heat-treating for 20 minutes at 400° C. in a nitrogen atmosphere.

The following provides a detailed description of the process for forming an irregular surface structure on a current spreading layer located on the light extraction side.

First, a thin film was formed on the current spreading layer p-GaP according to the same method as Example 1 using the solution prepared in Example 1 to express a microphase separation pattern. The resulting phase separation pattern demonstrated morphology such that a microdomain in the form of PS islands was formed in a PMMA matrix.

Next, the PMMA matrix portion of the phase separation pattern having low etching resistance was selectively removed by carrying out oxygen plasma etching ($O_2$=5 sccm, Ar=25 sccm, pressure: 13.3 Pa, bias: 100 W) using an RIE system (Samco, RIE-200L) to form a PS dot mask on the current spreading layer p-GaP.

Continuing, etching was carried out with an inductively coupled plasma (ICP)-RIE system (Samco, RIE-101iPM) based on the PS dot mask formed on the p-GaP. Etching conditions consisted of $Cl_2$=5 sccm, Ar=15 sccm, pressure: 0.7 Pa, bias: 100 W and ICP: 30 W. The residual PS mask was removed by carrying out oxygen ashing for 1 minute after etching to form an irregular surface structure on the p-GaP. The average center of gravity distance between the convex portions formed was 290 nm, the height of the convex portions was 200 nm, and the ratio of the area of the entire wafer occupied by the convex portions (occupancy rate) was 45%.

Example 31

An LED was fabricated using the same method as Example 30 with the exception of using the solution prepared in Example 3. In the irregular surface structure formed, the average center of gravity distance between the convex portions was 430 nm, the height of the convex portions was 200 nm, and the occupancy rate was 45%.

Example 32

An LED was fabricated using the same method as Example 30 with the exception of using the solution prepared in Example 4. In the irregular surface structure formed, the average center of gravity distance between the convex portions was 570 nm, the height of the convex portions was 200 nm, and the occupancy rate was 45%.

Comparative Example 5

An LED was fabricated using the same method as Example 30 with the exception of using the solution prepared in Comparative Example 1. In the irregular surface structure formed, the average center of gravity distance between the convex portions was 140 nm, the height of the convex portions was 200 nm, and the occupancy rate was 45%.

Comparative Example 6

An LED having the same structure as Example 30 was prepared in Comparative Example 6 with the exception of not forming surface irregularities on the surface of the current spreading layer.

The outputs of the semiconductor light-emitting elements fabricated in Examples 30 to 32 and Comparative Examples 5 and 6 were measured. The results are summarized in the following Table 5. In Table 5, light extraction efficiency is represented by a relative value based on a value of 1 for the optical output of a semiconductor light-emitting element in which surface irregularities were not formed (Comparative Example 6).

TABLE 5

Shape of Irregular Surface Pattern Formed on Surface of Semiconductor Light-Emitting Element and Light Extraction Efficiency (1)

|   | Extraction Surface | Avg. Distance Between Convex Portions (nm) | Convex portion height (nm) | Occupancy rate (%) | Extraction Efficiency (a.u.) |
|---|---|---|---|---|---|
| Ex. 30 | Irregular surface structure | 290 | 200 | 45 | 1.43 |
| Ex. 31 | " | 430 | 200 | 45 | 1.30 |
| Ex. 32 | " | 570 | 200 | 45 | 1.66 |
| Comp. Ex. 5 | " | 140 | 200 | 45 | 1.24 |
| Comp. Ex. 6 | Flat | — | — | — | 1.00 |

On the basis of Table 5, the formation of an irregular surface structure on a light extraction surface was determined to improve light extraction efficiency. In addition, even if an irregular surface structure is formed, the effect thereof was determined to differ according to differences in the average distance between the convex portions thereof, and the rate of improvement tended to increase in Example 30 having a large average distance between convex portions. This is due to the obtaining of high optical diffraction effects as a result of the average distance between convex portions in the irregular surface structure of Example 32 being roughly equal to the emission wavelength in contrast to the average distance between convex portions in the irregular surface structure of Comparative Example 5 being smaller (⅙ or less) than the emission wavelength.

Example 33

In the present example, surface irregularities were formed on the light extraction surface of an LED element having an emission wavelength of 440 nm using the solution prepared in Example 5.

First, an n-type GaN buffer layer, n-type GaN cladding layer, MQW active layer composed of InGaN/GaN, p-type AlGaN cap layer and p-type GaN contact were sequentially formed on a sapphire substrate by MOCVD. Continuing, a p-side electrode layer was formed on the p-type contact layer and an n-side electrode layer was formed on the sapphire substrate by vacuum deposition followed by forming into a desired shape. Finally, heat treatment was carried out to form ohmic contacts on the contact surfaces between each of the electrode layers and the element.

Next, surface irregularities were formed on the light extraction surface of the LED. In general, in the case of using a polymer as a mask, it is difficult to form surface irregularities having a high aspect ratio on GaN, which has a high resistance to etching in comparison with other compound semiconductors. Consequently, in the present example, an irregular surface structure was formed using pattern transfer. The details of the pattern transfer method are disclosed in Patent Document 1. In providing a detailed explanation thereof, after forming an inorganic composition thin film on the light extraction surface to serve as an intermediate mask layer, a resin composition thin film containing a block copolymer is formed to cause microphase separation, after which the dot pattern of the block copolymer is transferred to the inorganic composition thin film by RIE or a wet etching process. As a result, an irregular surface structure having a high aspect ratio can be fabricated on the extraction surface.

The following provides a detailed explanation of the experiment method.

First, a spin-on-glass (SOG) solution (Tokyo Chemical Industry, OCD-Type 7 5500T) was spin-coated for 30 seconds at a rotating speed of 1800 rpm onto the formed p-type GaN contact layer. After pre-baking for 90 seconds at 110° C. on a hot plate, baking was carried out for 30 minutes at 300° C. in a nitrogen atmosphere to form an SOG film having a thickness of 100 nm on the p-type GaN contact layer. Next, a thin film was formed on the SOG film using the solution prepared in Example 4 according to the same method as Example 1 to express a microphase separation pattern. After removing the PMMA matrix portion of the microphase separation pattern by RIE in the same manner as Example 30, RIE was carried out using $F_2$-based gas ($CF_4$=10 sccm, $CHF_3$=20 sccm, 0.7 Pa, 100 W) to transfer the pattern of the PS polymer dot portion to the underlying SOG film. Subsequently, the residual PS polymer dot portion was removed by oxygen asking to form an SOG mask.

Continuing, the underlying p-type GaN contact layer was etched by ICP-RIE using the formed SOG mask. The conditions of ICP-RIE consisted of $Cl_2$=2 sccm, Ar=18 sccm, 0.7 Pa, bias=300 W and ICP=15 W. Subsequently, the mask was removed using an aqueous hydrofluoric acid solution (5% by weight) to form an irregular surface structure. In the irregular surface structure formed, the average center of gravity distance between convex portions was 250 nm, the height of the convex portions was 450 nm, and the occupancy rate was 50%.

Example 34

An LED was fabricated using the same method as Example 33 with the exception of using the solution prepared in Example 6. In the irregular surface structure formed, the average center of gravity distance between convex portions was 320 nm, the height of the convex portions was 450 nm, and the occupancy rate was 50%.

Example 35

An LED was fabricated using the same method as Example 33 with the exception of using the solution prepared in Example 7. In the irregular surface structure formed, the average center of gravity distance between convex portions was 470 nm, the height of the convex portions was 450 nm, and the occupancy rate was 50%.

Comparative Example 7

An LED was fabricated using the same method as Example 33 with the exception of using the solution prepared in Comparative Example 1. In the irregular surface structure formed, the average center of gravity distance between convex portions was 140 nm, the height of the convex portions was 450 nm, and the occupancy rate was 50%.

Comparative Example 8

An LED was prepared in Comparative Example 8 having the same structure as Example 33 with the exception of not forming surface irregularities on the surface of the current spreading layer.

The outputs of the semiconductor light-emitting elements fabricated in Examples 33 to 35 and Comparative Examples 7 and 8 were measured. The results are summarized in the following Table 6. In Table 6, light extraction efficiency is represented by a relative value based on a value of 1 for the optical output of a semiconductor light-emitting element in which surface irregularities were not formed (Comparative Example 8).

TABLE 6

Shape of Irregular Surface Pattern Formed on Surface of Semiconductor Light-Emitting Element and Light Extraction Efficiency (2)

|  | Extraction Surface | Avg. Distance Between Convex Portions (nm) | Convex portion height (nm) | Occupancy rate (%) | Extraction Efficiency (a.u.) |
|---|---|---|---|---|---|
| Ex. 33 | Irregular surface structure | 250 | 450 | 50 | 1.50 |
| Ex. 34 | " | 320 | 450 | 50 | 1.43 |
| Ex. 35 | " | 470 | 450 | 50 | 1.59 |
| Comp. Ex. 7 | " | 140 | 450 | 50 | 1.12 |
| Comp. Ex. 8 | Flat | — | — | — | 1.00 |

*)Light extraction surface: p-GaN, emission wavelength: 400 nm

Similar to Table 5, an irregular surface structure capable was able to be formed that is capable of realizing high light extraction efficiency even in the case of an LED having an emission wavelength of 440 nm by applying the resin composition for pattern formation and the pattern formation method according to the present invention.

The use of a pattern obtained according to the present invention in this manner makes it possible to form an irregular surface structure of a size in which the distance between convex portions is roughly equal to the wavelength of the light (200 nm to 800 nm). As a result, high optical diffraction effects can be imparted to the surface of a light-emitting element and the brightness of various types of light-emitting elements can be improved.

INDUSTRIAL APPLICABILITY

Etching using the resin composition for pattern formation according to the present invention as a resist makes it possible to form fine surface irregularities on the surface of a light-emitting element and improve the brightness thereof.

BRIEF DESCRIPTION OF THE REFERENCE SYMBOLS

1 Crystal substrate
2 n-type semiconductor layer (cladding layer)
3 Active layer
4 p-type semiconductor layer (cladding layer)
5 Current spreading layer
6 p-type electrode
7 n-type electrode
8 Fine surface irregularities
9 Block copolymer-containing resin composition
10 Polymer dot portion

The invention claimed is:
1. A resin composition for pattern formation comprising the following:
   a block copolymer (a) containing an aromatic ring-containing polymer and a poly(meth)acrylate as block moieties, wherein the number average molecular weight of the block copolymer (a) is 300,000 to 5,000,000, the ratio of the total of the aromatic ring-containing polymer moiety and the poly(meth)acrylate moiety to the entire block polymer (a) is 50 mol % or more, and the molar ratio of the aromatic ring-containing polymer moiety to the poly(meth)acrylate moiety is 1:1 to 1:5;

an aromatic ring-containing homopolymer (b) composed of a monomer that composes the aromatic ring-containing polymer contained in the block copolymer (a) as a block moiety, wherein the weight average molecular weight of the aromatic ring-containing homopolymer (b) is 1,500 to 8,000; and a poly(meth)acrylate homopolymer (c) composed of a monomer that composes the poly(meth)acrylate contained in the block copolymer (a) as a block moiety, wherein the weight average molecular weight of the poly(meth)acrylate homopolymer (c) is 1,500 to 14,000; wherein, the weight ratio of the total of the aromatic ring-containing homopolymer (b) and the poly(meth)acrylate homopolymer (c) to the entire resin composition is 10% by weight to 90% by weight, and the weight ratio of the total of the aromatic ring-containing polymer moiety contained in the block copolymer (a) as a block moiety and the aromatic ring-containing homopolymer (b) to the entire resin composition is 10% by weight to 60% by weight.

2. The resin composition for pattern formation according to claim 1, wherein the aromatic ring-containing polymer contained in the block copolymer (a) as a block moiety is polystyrene.

3. The resin composition for pattern formation according to claim 1 or 2, wherein the block copolymer (a) is a diblock copolymer of polystyrene and poly(methyl methacrylate).

4. The resin composition for pattern formation according to claim 1, wherein the weight average molecular weight of the aromatic ring-containing homopolymer (b) is 1,500 to 5,000.

5. The resin composition for pattern formation according to claim 4, wherein the weight average molecular weight of the aromatic ring-containing homopolymer (b) is 2,500 to 5,000.

6. The resin composition for pattern formation according to claim 1, wherein the aromatic ring-containing homopolymer (b) has an $R_1R_2(CN)C$— group on the terminal thereof wherein, $R_1$ and $R_2$ mutually and independently represent a $C_1$-$C_6$ alkyl group or alkoxyalkyl group.

7. The resin composition for pattern formation according to claim 6, wherein $R_1$ and $R_2$ are both methyl groups.

8. The resin composition for pattern formation according to claim 1, wherein the weight average molecular weight of the poly(meth)acrylate homopolymer (c) is 2,500 to 14,000.

9. The resin composition for pattern formation according to claim 1, wherein the poly(meth)acrylate homopolymer (c) has an aliphatic group on the terminal thereof.

10. The resin composition for pattern formation according to claim 1, wherein the weight ratio of the total of the aromatic ring-containing homopolymer (b) and the poly(meth)acrylate homopolymer (c) to the entire resin composition is 40% by weight to 80% by weight, and the weight ratio of the total of the aromatic ring-containing polymer moiety contained in the block copolymer (a) as a block moiety and the aromatic ring-containing homopolymer (b) to the entire resin composition is 20% by weight to 50% by weight.

11. A solution for pattern formation obtained by dissolving the resin composition for pattern formation according to claim 1 in a solvent, wherein the weight ratio of the resin composition to the solution is 1% by weight to 30% by weight.

12. The solution for pattern formation according to claim 11, wherein the solvent is at least one type of solvent selected from the group consisting of ethyl cellosolve acetate, propylene glycol monomethyl ether acetate, N-methylpyrrolidone, γ-butyrolactone, cyclopentanone, propylene glycol monomethyl ether and ethyl lactate.

13. A method for forming a pattern having a sea-island structure, comprising the steps of:
coating the solution for pattern formation according to claim 11 onto a substrate, and evaporating the solvent in the solution to form a thin film having a thickness of 1 μm or less, and
heating the thin film at a temperature of 130° C. to 280° C. over a time from 1 minute to 100 hours; wherein,
the pattern having a sea-island structure is a microphase separation structure in which an aromatic ring-containing polymer phase serves as the islands and a poly(meth)acrylate polymer phase serves as the sea, the average center of gravity distance between the islands is 200 nm to 800 nm, and the area average circularity coefficient of the islands is 0.7 or more.

14. The method for forming a pattern having a sea-island structure according to claim 13, wherein the step for heating the thin film is carried out on a hot plate over a time of 1 minute to 1 hour.

15. The method for forming a pattern having a sea-island structure according to claim 13, wherein the step for heating the thin film is carried out in an oven.

16. The method for forming a pattern having a sea-island structure according to claim 13, wherein the step for heating the thin film is carried out in a mixed gas atmosphere of oxygen and an inert gas in which the oxygen concentration is 0.05% by volume to 25% by volume.

17. The method for forming a pattern having a sea-island structure according to claim 16, wherein the step for heating the thin film is carried out in a mixed gas atmosphere of oxygen and an inert gas in which the oxygen concentration is 0.05% by volume to 15% by volume.

18. A process for producing a light-emitting element, comprising the steps of:
selectively removing at least one of the phases of a sea-island structure formed by the pattern formation method according to claim 13, and
etching the surface of the light-emitting element using the remaining phase as an etching mask.

19. A method for forming a pattern having a sea-island structure, comprising the steps of:
(1) forming a thin film having a thickness of 1 μm or less by coating onto a substrate a solution of a resin composition for pattern formation comprising block copolymer (a) and [aromatic ring-containing homopolymer (b) and/or poly(meth)acrylate homopolymer (c)], wherein:
said block copolymer (a) contains an aromatic ring-containing polymer and a poly(meth)acrylate as block moieties, wherein the number average molecular weight of the block copolymer (a) is 300,000 to 5,000,000, the ratio of the total of the aromatic ring-containing polymer moiety and the poly(meth)acrylate moiety to the entire block polymer (a) is 50 mol % or more, and the molar ratio of the aromatic ring-containing polymer moiety to the poly(meth)acrylate moiety is 1:1 to 1:5;
said aromatic ring-containing homopolymer (b) is composed of a monomer that composes the aromatic ring-containing polymer contained in the block copolymer (a) as a block moiety, wherein the weight average molecular weight of the aromatic ring-containing homopolymer (b) is 1,500 to 8,000; and
said poly(meth)acrylate homopolymer (c) is composed of a monomer that composes the poly(meth)acrylate contained in the block copolymer (a) as a block moiety, wherein the weight average molecular weight of the poly(meth)acrylate homopolymer (c) is 1,500 to 5,000,000; wherein, the weight ratio of the total of the aromatic ring-containing homopolymer (b) and the poly(meth)acrylate homopolymer (c) to the entire resin composition is 0% by weight to 90% by weight, and the weight ratio of the total of the aromatic ring-containing polymer moiety contained in the block copolymer (a) as a block moiety and the aromatic ring-containing homopolymer (b) to the entire resin composition is 10% by weight to 60% by weight, followed by evaporating the solvent in the solution; and, (2) heating the thin film at a temperature of 130° C. to 280° C. over a time of 1 minute to 100 hours in a mixed gas atmosphere of oxygen and an inert gas in which the oxygen concentration is 0.05% by volume to 25% by volume; wherein the pattern having a sea-island structure is a microphase separation structure in which an aromatic ring-containing polymer layer serves as the islands and a poly(meth)acrylate polymer phase serves as the sea, the average center of gravity distance between the islands is 200 nm to 800 nm, and the area average circularity coefficient of the islands is 0.65 or more.

20. The method for forming a pattern having a sea-island structure according to claim 19, wherein the weight ratio of the total of the aromatic ring-containing homopolymer (b) and the poly(meth)acrylate homopolymer (c) to the entire resin composition is 10% by weight to 90% by weight.

21. The method for forming a pattern having a sea-island structure according to claim 19 or 20, wherein the step for heating the thin film is carried out in a mixed gas atmosphere of oxygen and an inert gas in which the oxygen concentration is 0.05% by volume to 15% by volume.

22. The method for forming a pattern having a sea-island structure according to claim 19, wherein the step for heating the thin film is carried out on a hot plate over a time of 1 minute to 1 hour.

23. The method for forming a pattern having a sea-island structure according to claim 19, wherein the step for heating the thin film is carried out in an oven.

24. A process for producing a light-emitting element having a structure having fine surface irregularities on the surface thereof, comprising the steps of:

using a light-emitting element as a substrate, forming a pattern having a sea-island structure on the surface thereof according to the pattern formation method according to claim 19, and selectively removing at least one of the phases of the formed sea-island structure; and etching the surface of the light-emitting element by using the remaining phase as an etching mask.

* * * * *